United States Patent
Sato et al.

(10) Patent No.: US 10,515,877 B2
(45) Date of Patent: Dec. 24, 2019

(54) SEMICONDUCTOR DEVICE AND METHOD OF MANUFACTURING THE SAME

(71) Applicant: Renesas Electronics Corporation, Koutou-ku, Tokyo (JP)

(72) Inventors: Yukihiro Sato, Tokyo (JP); Toshinori Kiyohara, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/934,310

(22) Filed: Mar. 23, 2018

(65) Prior Publication Data
US 2018/0315684 A1 Nov. 1, 2018

(30) Foreign Application Priority Data
Apr. 27, 2017 (JP) .................. 2017-087869

(51) Int. Cl.
*H01L 23/495* (2006.01)
*H01L 23/31* (2006.01)
*H01L 23/00* (2006.01)

(52) U.S. Cl.
CPC .... *H01L 23/49513* (2013.01); *H01L 23/3142* (2013.01); *H01L 23/49524* (2013.01);
(Continued)

(58) Field of Classification Search
CPC ......... H01L 23/49575; H01L 23/49541; H01L 23/49562; H01L 23/49524; H01L 23/3142; H01L 23/3107; H01L 23/49552; H01L 2924/181; H01L 2224/0603; H01L 2224/4813; H01L 2224/4903;
(Continued)

(56) References Cited

U.S. PATENT DOCUMENTS 6,534,878 B1  3/2003 Sander et al.
2007/0085221 A1  4/2007 Tanabe
(Continued)

FOREIGN PATENT DOCUMENTS

DE  10 2005 039 940 A1  3/2007
EP      2 091 081 A1  8/2009
(Continued)

OTHER PUBLICATIONS

Extended European Search Report dated Oct. 1, 2018, in European Patent Application No. 18166322.0.

*Primary Examiner* — Chuong A Luu
(74) *Attorney, Agent, or Firm* — Shapiro, Gabor and Rosenberger, PLLC

(57) ABSTRACT

A performance of a semiconductor device is improved. The semiconductor device according to one embodiment includes a wire bonded to one bonding surface at a plurality of parts in an opening formed in an insulating film of a semiconductor chip. The semiconductor device includes also a sealer that seals the semiconductor chip and the wire so that the sealer is in contact with the bonding surface. The bonding surface includes a first region to which a bonding portion of the wire is bonded, a second region to which another bonding portion of the wire is bonded, and a third region between the first region and the second region. A width of the third region is smaller than a width of the first region and a width of the second region.

16 Claims, 23 Drawing Sheets

(52) U.S. Cl.
CPC .. *H01L 23/49541* (2013.01); *H01L 23/49562* (2013.01); *H01L 23/49575* (2013.01); *H01L 24/05* (2013.01); *H01L 24/48* (2013.01); *H01L 23/3107* (2013.01); *H01L 24/45* (2013.01); *H01L 2224/0603* (2013.01); *H01L 2224/32245* (2013.01); *H01L 2224/45124* (2013.01); *H01L 2224/45139* (2013.01); *H01L 2224/45144* (2013.01); *H01L 2224/45147* (2013.01); *H01L 2224/4813* (2013.01); *H01L 2224/4846* (2013.01); *H01L 2224/48247* (2013.01); *H01L 2224/48472* (2013.01); *H01L 2224/4903* (2013.01); *H01L 2224/73265* (2013.01); *H01L 2924/13055* (2013.01); *H01L 2924/181* (2013.01)

(58) Field of Classification Search
CPC ... H01L 2224/4846; H01L 2224/32245; H01L 2224/48247; H01L 2224/48472; H01L 2224/3265; H01L 23/495; H01L 23/49513

USPC .......................................................... 257/676
See application file for complete search history.

(56) References Cited

U.S. PATENT DOCUMENTS

| | | |
|---|---|---|
| 2007/0108601 A1 | 5/2007 | Ong et al. |
| 2015/0255444 A1 | 9/2015 | Sato |
| 2018/0122766 A1* | 5/2018 | Okunishi .......... H01L 23/49524 |

FOREIGN PATENT DOCUMENTS

| | | |
|---|---|---|
| JP | S61-290747 A | 12/1986 |
| JP | 2000-503491 A | 3/2000 |
| JP | 2000-114307 A | 4/2000 |
| JP | 2012-195459 A | 10/2012 |

* cited by examiner

SEMICONDUCTOR DEVICE AND METHOD OF MANUFACTURING THE SAME

CROSS-REFERENCE TO RELATED APPLICATION

The present application claims priority from Japanese Patent Application No. 2017-087869 filed on Apr. 27, 2017, the content of which is hereby incorporated by reference into this application.

TECHNICAL FIELD OF THE INVENTION

The present invention relates to a semiconductor device and a method of manufacturing the same. For example, the present invention relates to a semiconductor device in which a part of a lead connected to a wire is sealed with a resin sealer.

BACKGROUND OF THE INVENTION

Japanese Patent Application Laid-open Publication No. 2000-503491 (Patent Document 1) describes a power semiconductor device in which a plurality of wires are connected to a plurality of electrode pads on an upper surface of a semiconductor chip. And, the Patent Document 1 also describes a structure in which wires are connected to a plurality of positions in a part of the plurality of electrode pads.

Japanese Patent Application Laid-open Publication No. S61-290747 (Patent Document 2) describes a structure in which a bonding pad is connected to a test pad via a wiring.

SUMMARY OF THE INVENTION

The inventors of the present application have studied improvement of a performance of a semiconductor device. For example, a technique of bonding one wire to a plurality of positions of one electrode pad of a semiconductor chip is cited. An electrode formation surface of the semiconductor chip is covered with an insulating film serving as a protective film. When the wire is bonded to the plurality of positions of the electrode pad, the wire is easy to be bonded by increasing an opening area of an opening formed on the protective film. However, it has been found out that a resin (resin sealer) that seals the wire is peeled off from a part of the electrode pad, the part being not connected with the wire and being exposed from the protective film, because of the weak strength of the bonded interface between a metal material making up the electrode pad and the resin material sealing the wire. Even if the electrode pad and the resin sealer are peeled off from each other, the function of the semiconductor device is not immediately damaged. However, in consideration of long-term product quality such as the service life of the semiconductor device or others, it is preferable to suppress the peeling off between the resin sealer and the electrode pad.

Other object and novel characteristics will be apparent from the description of the present specification and the accompanying drawings.

A semiconductor device according to one embodiment includes a wire bonded to a plurality of positions of one bonding surface of a first opening formed on an insulating film of a semiconductor chip. The semiconductor device also includes a sealer that seals the semiconductor chip and the first conductive member so that the sealer is in contact with the bonding surface. The bonding surface includes a first region to which a first bonding portion of the wire is bonded, a second region to which a second bonding portion of the wire is bonded, and a third region located between the first region and the second region. A width of the third region is smaller than widths of the first region and the second region.

According to the above-described one embodiment, the performance of the semiconductor device can be improved.

BRIEF DESCRIPTIONS OF THE DRAWINGS

Figure 1:
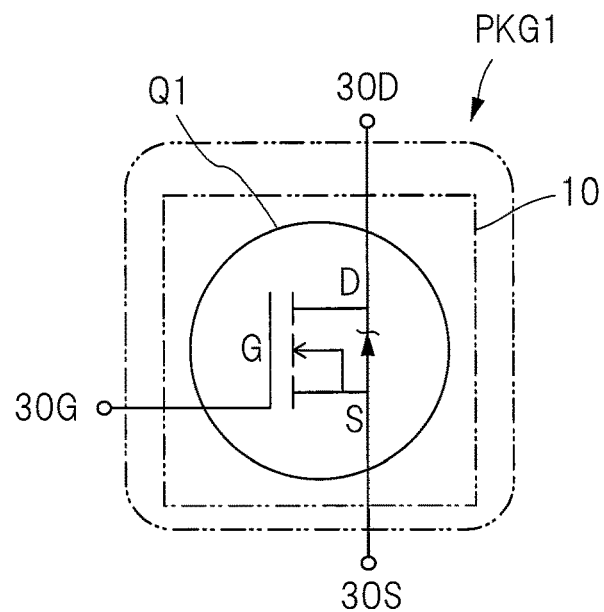
FIG. 1 is an explanatory diagram schematically showing an example of a circuit included in a semiconductor device of one embodiment.

DESCRIPTIONS OF THE PREFERRED EMBODIMENTS (Explanation of Description Form, Basic Term and Usage in Present Application)

In the present application, the embodiments will be described in a plurality of sections or others as needed when required as a matter of convenience. However, these sections or others are not irrelevant to each other unless otherwise particularly stated, and these sections are modification examples or others in which one of each part of a simple example relates to a detailed part, a part, or the entire of the other, regardless of before and after the description. Also, in principle, the repetitive description of the same part is omitted. Further, each element in the embodiment is not indispensable unless otherwise particularly stated not to be so, logically limited to the number, and clearly not being so from the contexts.

Similarly, when "X made of A" or others is described for materials, compositions, and others in the description of the embodiment and others, the one containing other components than A is not eliminated unless otherwise stated not to be so and clearly not being so from the contexts. For example, the component means "X containing A as a main component" or others. For example, it is needless to say that a "silicon material" and others includes not only pure silicon but also SiGe (silicon germanium) alloy or other multicomponent alloy containing silicon as a main component, or a member containing other additives or others. Also, gold plating, a Cu layer, nickel plating, and others include not only pure material but also members containing gold, Cu, nickel, and others as a main component, respectively, unless otherwise specified not to be so.

Further, even when a specific numerical value and numerical amount are mentioned, the specific numerical value and the numerical amount may exceed the specific numerical values or smaller than the specific numerical values unless otherwise specified not to be so, logically limited to the number, and clearly not being so from the contents.

Still further, in each drawing of the embodiment, the same or similar parts are denoted by the same or similar symbol or reference number, and the description thereof is not repeated in principle.

Also, in the attached drawings, hatching or others is omitted even in a cross-sectional view in some cases such as a case of causing complication or a case of clearly distinguishing a portion from a space. In respect to this, in some cases such as a case of clearly describing a portion from the description or others, a background outline is omitted even in a closed hole in a plan view. Further, in some cases, hatching or a dot pattern is added to a drawing even if the drawing is not a cross-sectional view in order to clearly describe the fact that the portion is not the space or clearly describe a boundary between regions.

In the following description, terms "contact", "adhesion", "bonding", "peeling off", and "connection" are used in the following meanings. The term "contact" represents a state in which two separable members are in contact with each other in at least a part of them. The term "adhesion" represents a state in which two separable members (bonded materials) are coupled and fixed to each other via an adhesive in at least a part of them. The term "bonding" represents a state in which two separable members (bonded materials) are coupled and fixed to each other in at least a part of them. The above-described term "coupling" includes mechanical coupling such as an anchoring effect, coupling caused by a physical interaction such as intermolecular force, and coupling caused by a chemical interaction such as covalent bonding. The term "bonding" includes not only a case in which a different material (e.g., adhesive) is interposed between the bonded materials but also a case in which no different material is interposed therebetween. That is, a "bonded state" includes an "adhered state". The term "peeling off" represents a state in which the above-described "bonded state" is released and changed into a separable state. A simply-termed "peeling off" includes not only a case in which the coupling is released in the entire bonded part between two members but also a case in which the coupling is released in a part of the bonded part. The term "connection" represents a state in which two members communicate with each other (in which a connection path is not interrupted in its middle and is continuously linked). It is irrelevant whether a different member is interposed between two members or not. For example, "state in which a member A and a member B are electrically connected" represents an electrical conductible state between the member A and the member B, and also includes a case in which a member C is interposed between the member A and the member B. A simple term. "state in which the member A and the member B are connected" represents a state in which the member A and the member B are fixed to each other, and also includes a case in which the member C is interposed between the member A and the member B. For example, "state in which the member A and the member B are connected" also includes a case in which the member A and the member B are formed integrally into an inseparable single object and yet are distinguished from each other in terms of shape and function. Such a state in which the member A and member B are formed into the single object is termed as "joint" in some cases.

In the following description, when solder, solder member, solder material, or solder component is mentioned, the term represents, for example, Sn—Pb solder containing lead (Pb) or so-called lead-free solder substantially not containing Pb. As examples of the lead-free solder, for example, only tin (Sn), tin-bismuth (Sn—Bi), tin-copper-silver (Sn—Cu—Ag), tin-copper (Sn—Cu) and others are cited. Here, the lead-free solder represents a material having lead (Pb) content of 0.1 wt % or less. This content is defined as standards of the RoHS (Restriction of Hazardous Substances) directive.

In the present embodiment, as an example of a semiconductor device, a power device embedded into a power control circuit of a power supply circuit, etc., or a semiconductor device that is referred to as power semiconductor device will be exemplified and described. A semiconductor device described below is embedded into a power conversion circuit, and functions as a switching element.

<Example of Circuit Configuration>

Figure 2:
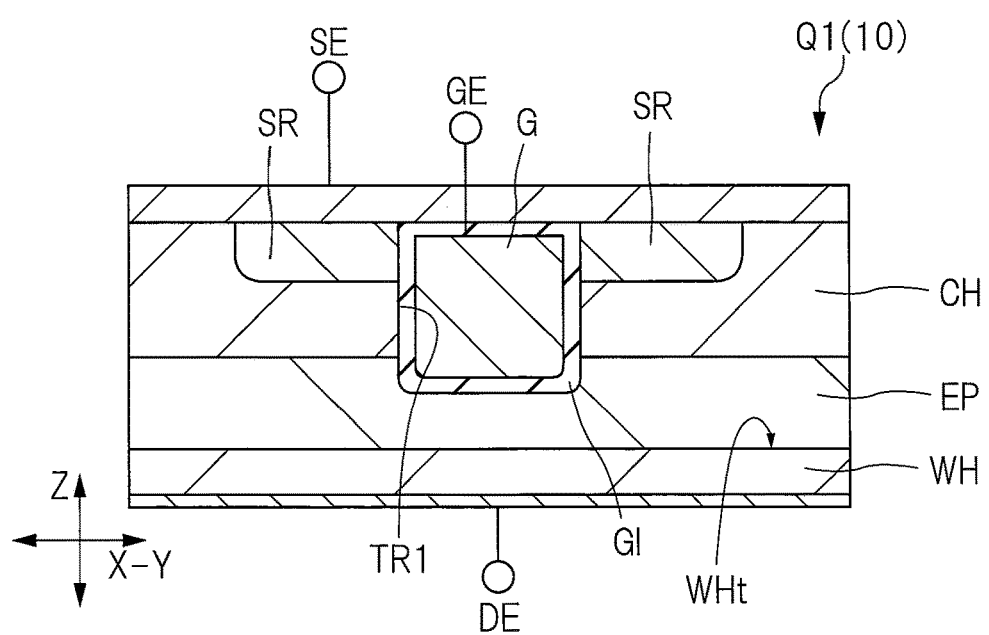
FIG. 2 is a cross-sectional view of a principal part showing an example of an element structure of a field-effect transistor shown in FIG. 1.

FIG. 1 is an explanatory diagram schematically showing an example of a circuit included in a semiconductor device of the present embodiment. FIG. 2 is a cross-sectional view of a principal part showing an example of an element structure of a field-effect transistor shown in FIG. 1.

Some semiconductor devices for power control, each of which is referred to as power semiconductor device, include semiconductor elements such as diodes, thyristors, and transistors. A transistor is used in various fields. As described in the present embodiment, a transistor functioning as a switching element embedded into a power control circuit through which a large current of, for example, 1 A (ampere) or larger flows is referred to as power transistor. A semiconductor device PKG1 of the present embodiment includes a semiconductor chip 10 having a transistor Q1 serving as a power transistor as shown in FIG. 1. In the examples shown in FIGS. 1 and 2, the transistor Q1 formed on the semiconductor chip 10 is a field-effect transistor, more specifically, a MOSFET (Metal Oxide Semiconductor Field Effect Transistor). In a power semiconductor device, a transistor is used as, for example, a switching element. A MOSFET used for a power semiconductor device is referred to as power MOSFET.

The above-described MOSFET is described as a term that widely represents a field-effect transistor having a structure in which a gate electrode made of a conductive material is disposed on a gate insulating film. Therefore, even when the MOSFET is mentioned, a gate insulating film that is not an oxide film is not excluded. Also, even when the MOSFET is mentioned, a gate electrode material such as polysilicon that is not metal is not excluded.

The transistor Q1 shown in FIG. 1 is formed of, for example, an n-channel type field-effect transistor as shown in FIG. 2. FIG. 2 is a cross-sectional view of a principal part showing an example of an element structure of the field-effect transistor shown in FIG. 1.

In the example shown in FIG. 2, for example, an $n^-$-type epitaxial layer EP is formed on a main surface WHt of a semiconductor substrate WH made of n-type single crystal silicon. These semiconductor substrate WH and epitaxial layer EP make up a drain region (which corresponds to a drain "D" shown in FIG. 1) of the MOSFET. This drain region is electrically connected to a drain electrode DE formed on a back surface side of the semiconductor chip 10.

On the epitaxial layer EP, a channel formation region CH, which is a $p^+$-type semiconductor region, is formed. On this channel formation region CH, a source region SR (which corresponds to a source "S" illustrated in FIG. 1), which is an $n^+$-type semiconductor region, is formed. The source region SR is electrically connected to a source electrode pad (electrode, source electrode) SE formed on the main surface side of the semiconductor chip 10 via a leading-out wiring. In the semiconductor region stacked on the semiconductor substrate WH, a trench (opening, groove) TR1 is formed so as to penetrate from the upper surface of the source region SR through the channel formation region CH into the epitaxial layer EP.

On the inner wall of the trench TR1, a gate insulating film GI is formed. On the gate insulating film GI, a stacked gate electrode G is formed so as to be filled in the trench TR1. The gate electrode G is electrically connected to the gate electrode pad (electrode, gate electrode) GE of the semiconductor chip 10 via a leading-out wiring.

In the transistor Q1, the drain region and the source region SR are arranged across the channel formation region CH in the thickness direction, and therefore, a channel is formed in the thickness direction (which will hereinafter be referred to as "vertical channel structure"). In this case, an occupation area of the element in a plan view can be smaller than that of a field-effect transistor having a channel formed along the main surface WHt. Therefore, a plane size of the semiconductor chip 10 can be reduced.

In the case of the above-described vertical channel structure, a channel width per unit area in a plan view can be increased, and therefore, an on-resistance can be reduced. Note that FIG. 2 is a drawing showing the element structure of the field-effect transistor. In the semiconductor chip 10 shown in FIG. 1, for example, a plurality of (a number of) transistors Q1 each having, for example, the element structure as shown in FIG. 2 are connected in parallel. In this manner, a power MOSFET through which a large current exceeding, for example, 1 ampere flows through can be made up.

When the MOSFET is made up so that the plurality of the transistors Q1 having the vertical channel structure are connected in parallel as described above, the electrical characteristics (mainly, breakdown-voltage characteristics, on-resistance characteristics, capacity characteristics) of the MOSFET change in accordance with the plane size of the semiconductor chip 10. For example, by the increase in the plane area of the semiconductor chip 10, the number of cells of the transistors Q1 connected in parallel is increased, and therefore, the on-resistance decreases, and the capacity increases.

In FIGS. 1 and 2, note that the MOSFET is exemplified as an example of the power transistor included in the power semiconductor device. However, various modification examples are applicable. For example, in place of the MOSFET, the power semiconductor device may have an insulated gate bipolar transistor (IGBT).

<Semiconductor device>

Figure 3:
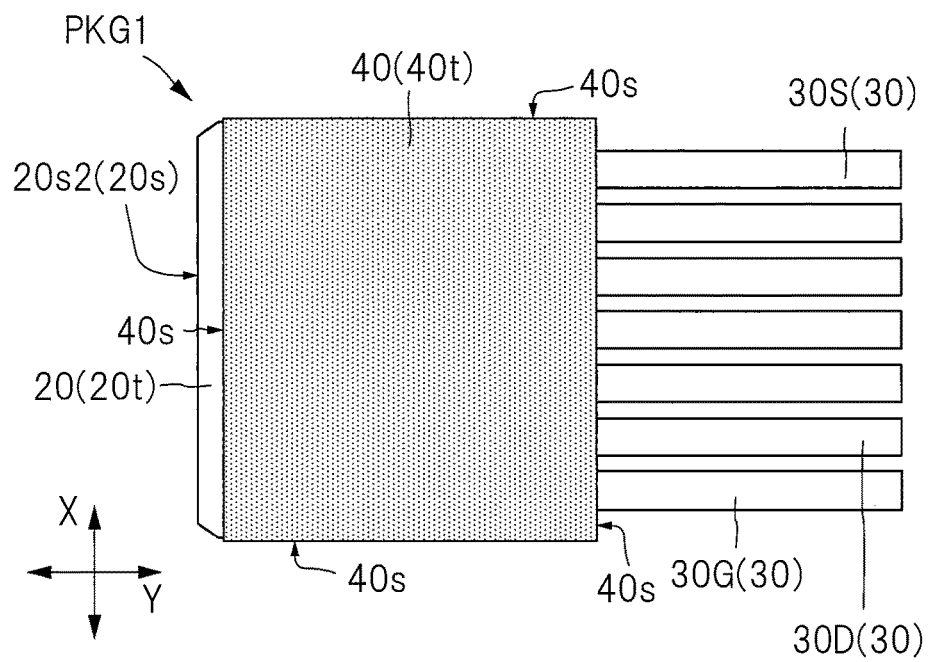
FIG. 3 is a top view of the semiconductor device shown in FIG. 1.
Figure 4:
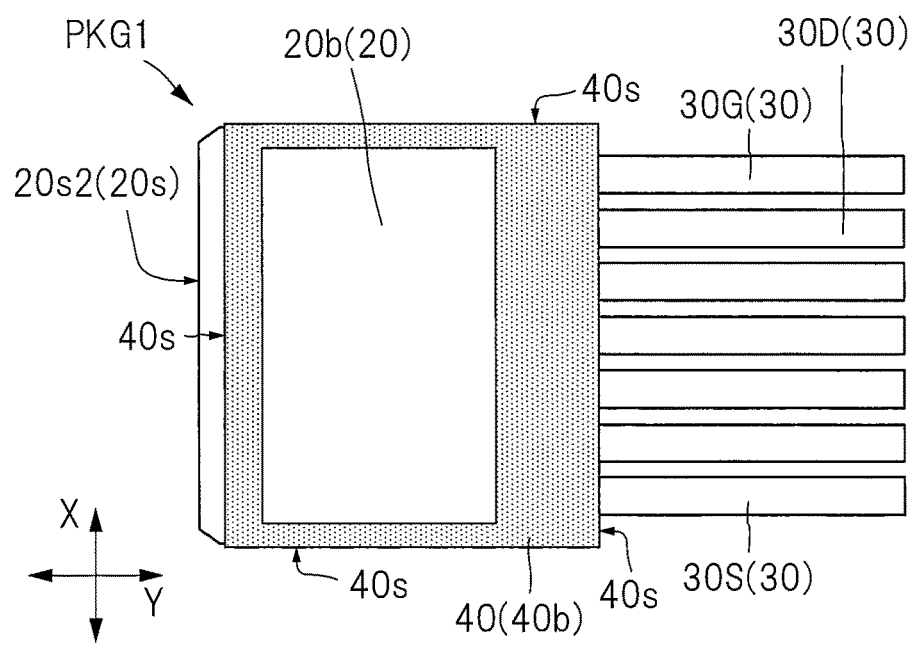
FIG. 4 is a bottom view of the semiconductor device shown in FIG. 3.
Figure 5:
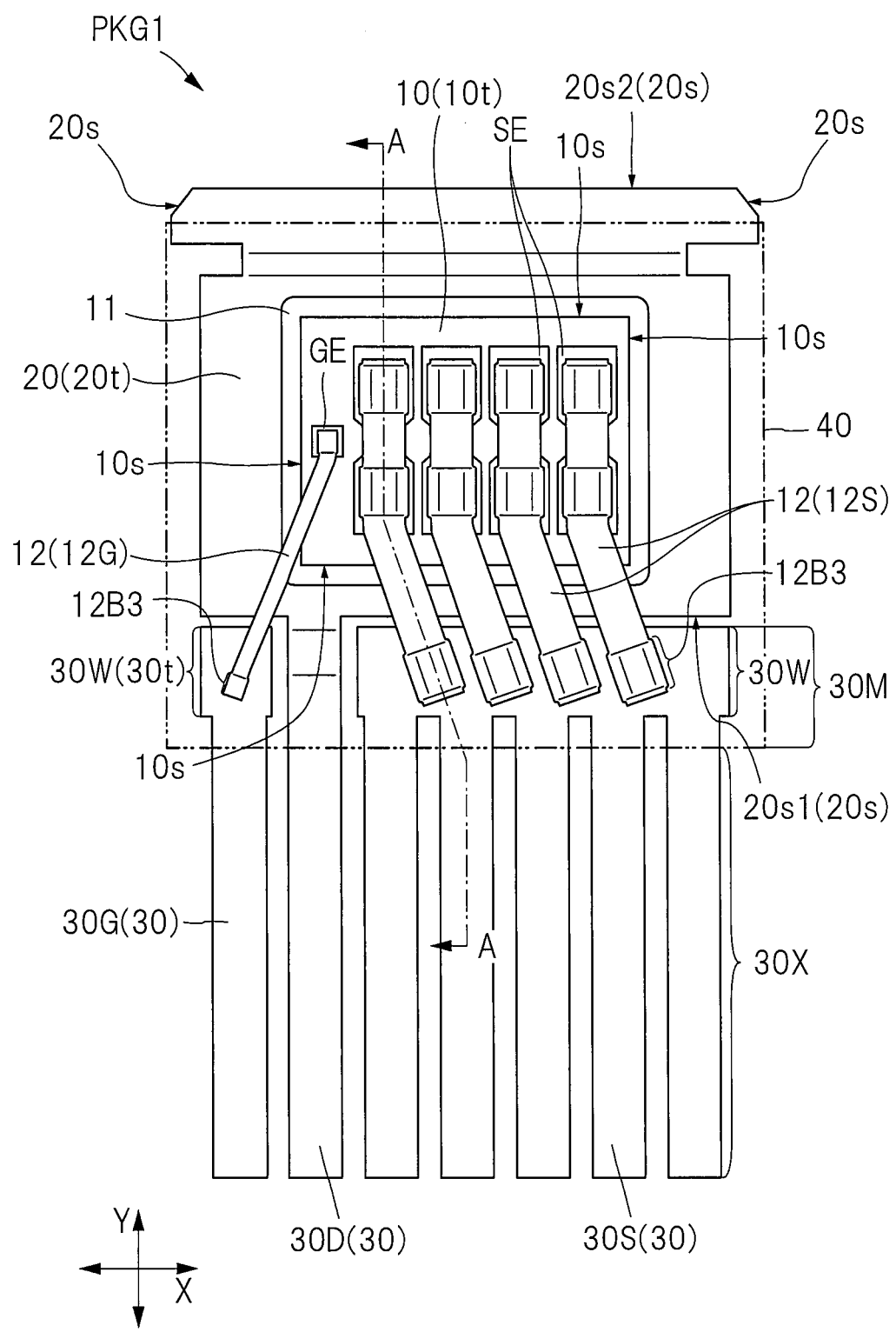
FIG. 5 is a perspective plan view showing an internal structure of the semiconductor device from which a sealer shown in FIG. 3 is removed.
Figure 6:
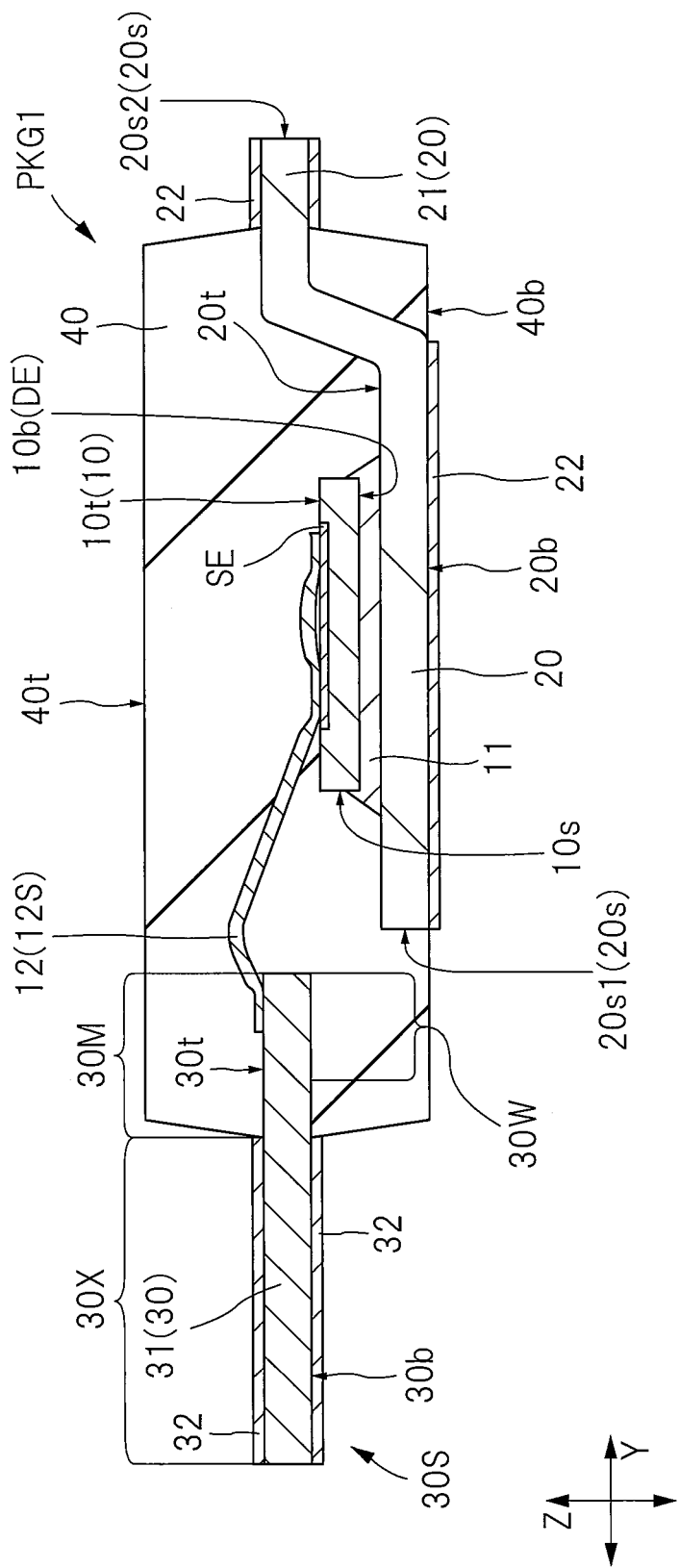
FIG. 6 is a cross-sectional view taken along a line A-A of FIG. 5.

Next, the package structure of the semiconductor device PKG1 shown in FIG. 1 will be described. FIG. 3 is a top view of the semiconductor device shown in FIG. 1. FIG. 4 is a bottom view of the semiconductor device shown in FIG. 3. FIG. 5 is a perspective plan view showing the internal structure of the semiconductor device from which a sealer shown in FIG. 3 is removed. FIG. 6 is a cross-sectional view taken along a line A-A of FIG. 5.

The semiconductor device PKG1 of the present embodiment includes the semiconductor chip 10 (see FIGS. 5 and 6), a die pad (metal plate, chip mounting portion, heat sink) 20 (see FIGS. 3 to 6) on which the semiconductor chip 10 is mounted, and a plurality of leads (terminals) 30 serving as external terminals. The semiconductor chip 10 and the plurality of leads 30 are electrically connected to each other via a plurality of wires 12 (see FIGS. 5 and 6). The semiconductor chip 10, the upper surface 20t of the die pad 20, and each inner portion (inner lead portion, sealed portion) 30M of the plurality of leads 30 (see FIGS. 5 and 6) are sealed with a sealer (resin sealer, resin material, mold resin) 40.

According to the present embodiment, in a plan view, the plurality of leads 30 are arranged side by side with the die pad 20 in the Y direction and are arranged side by side with each other in the X direction intersecting (orthogonally in FIG. 5) the Y direction, as shown in FIG. 5. In the example shown in FIG. 5, in a plan view, a plurality of leads 30S for the source (source leads, source terminals), a lead 30D for the drain (drain lead, drain terminal), and a lead 30G for the gate (gate lead, gate terminal) are sequentially arranged side by side along the X direction. Each of the plurality of leads 30 has the inner portion 30M sealed with the sealer 40, and an outer portion (outer lead portion, exposed portion) 30X exposed from the sealer 40. As shown in FIG. 6, each of the plurality of leads 30 has an upper surface 30*t* and a lower surface 30*b* opposite to the upper surface 30*t*.

As shown in FIG. 6, the semiconductor chip 10 has a front surface (surface, upper surface) 10*t* and a back surface (surface, lower surface) 10*b* opposite to the front surface 10*t*. As shown in FIG. 5, in a plan view, the front surface 10*t* (or the back surface 10*b* shown in FIG. 6) of the semiconductor chip 10 is formed into a quadrangular shape which has four side surfaces 10*s* on its periphery. In the example shown in FIG. 5, in a plan view, the semiconductor chip 10 is formed into a rectangular shape whose long side extends in the X direction.

As shown in FIG. 5, on the front surface 10*t* of the semiconductor chip 10, the gate electrode pad GE which is electrically connected to the gate electrode G (see FIG. 1) and the source electrode pad SE which is electrically connected to the source S (see FIG. 1) are formed. As shown in FIG. 6, on the back surface 10*b* of the semiconductor chip 10, the drain electrode (electrode) DE which is electrically connected to the drain D (see FIG. 1) is formed. In the example shown in FIG. 6, the whole of the back surface 10*b* of the semiconductor chip 10 serves as the drain electrode DE.

As shown in FIG. 2, when the semiconductor chip 10 has the vertical channel structure, its on-resistance can be reduced by reducing the thickness of the semiconductor chip 10 (reducing the distance between the front surface 10*t* and the back surface 10*b* shown in FIG. 6). On the other hand, from the viewpoint of increasing a heat capacity of the die pad 20 or the viewpoint of increasing a cross-sectional area of a conductive path through which a current flows, the die pad 20 preferably has a large thickness. For this reason, in the example shown in FIG. 6, the die pad 20 is made thicker than the semiconductor chip 10.

The semiconductor device PKG1 includes the die pad (metal plate, chip mounting portion, heat sink) 20 on which the semiconductor chip 10 is mounted. As shown in FIG. 6, the die pad 20 has an upper surface (surface, main surface, front surface, chip mounting surface) 20*t* on which the semiconductor chip 10 is mounted via a die bond material 11 and a lower surface (surface, main surface, back surface, exposed surface, mounting surface) 20*b* opposite to the upper surface 20*t*. In the example shown in FIG. 5, the plane size of the semiconductor chip 10 (the area of the front surface 10*t*) is smaller than the plane size of the die pad 20 (the area of the upper surface 20*t*). As shown in FIG. 4, the die pad 20 has a plurality of side surfaces 20*s* continuously formed to the lower surface 20*b* on its periphery.

As shown in FIG. 5, the die pad 20 is formed integrally with the lead 30D serving as the drain terminal. The lead 30D is the external terminal electrically connected to the drain D of FIG. 1. As shown in FIG. 6, on the back surface 10*b* of the semiconductor chip 10, the drain electrode DE which is connected to the drain D of the transistor Q1 (see FIG. 1) which is the MOSFET is formed. The drain electrode DE is electrically connected to the die pad 20 via the die bond material 11 made of a conductive material. The die bond material 11 is a solder or a conductive resin created by, for example, curing a mixture of a resin and conductive particles such as silver (Ag) particles. The lead 30D is connected to the die pad 20 and is electrically connected to the drain electrode DE of the semiconductor chip 10 via the die pad 20 and die bond material 11. The lead 30D is connected (coupled) to the die pad 20 and has a function as a suspension lead that supports the die pad 20 in a process of manufacturing the semiconductor device, which will be described later.

In the present embodiment, note that the lower surface 20*b* of the die pad 20 is exposed from the sealer 40. Therefore, the die pad 20 itself may be handled as the drain terminal. In the present embodiment, the explanation will be made while exemplifying the aspect of usage of the MOSFET as the power transistor, and therefore, the lead 30 and the die pad 20 operate as the drain terminal of the semiconductor device PKG1 in the term of a circuit. However, when an IGBT is used as the power transistor as a modification example, a collector electrode is formed on the back surface of the semiconductor chip. Therefore, when the power transistor is the IGBT, the lead 30 and the die pad 20 operate as the collector terminal of the semiconductor device PKG1 in terms of a circuit.

As shown in FIG. 5, the plurality of side surfaces 20*s* of the die pad 20 are provided so as to face the plurality of leads 30 in a plan view, respectively, and include a side surface 20*s*1 sealed with the sealer 40. The plurality of side surfaces 20*s* also include a side surface 20*s*2 which is opposite to the side surface 20*s*1, which is exposed from the sealer 40, and which is covered with a metal film 22 (see FIG. 6).

As shown in FIGS. 4 and 6, the lower surface 20*b* of the die pad 20 is exposed from the sealer 40 on the lower surface 40*b* side of the sealer 40. In the example shown in FIG. 4, the area of the lower surface 20*b* of the die pad 20 is equal to or smaller than the area of the lower surface 40*b* of the sealer 40. As shown in FIG. 3, in a plan view that is viewed from the upper surface 20*t* side of the die pad 20, a part of the die pad 20 protrudes outward from one side surface 40*s* of the plurality of side surfaces 40*s* of the sealer 40. As shown in FIGS. 3 and 6, a part of the upper surface 20*t* of the die pad 20 and some (at least the side surface 20*s*2) of the plurality of side surfaces 20*s* are exposed from the sealer 40. By increasing the plane size of the die pad 20 and exposing a part of the die pad 20 from the sealer 40 as described in the present embodiment, the efficiency of dissipating the heat generated in the semiconductor chip 10 is improved.

Since the lower surface 20*b* of the die pad 20 which is connected to the lead 30D serving as the external terminal is exposed from the sealer 40, the cross-sectional area of the conductive path through which the current flows can be increased. Therefore, an impedance component of the conductive path can be reduced. Particularly when the lead 30D serves as an external terminal for supporting an output node of a circuit included in the semiconductor device PKG1, the reduction in the impedance component of the conductive path connected to the lead 30D is preferable in that power loss of an output wiring can be directly reduced.

The die pad 20 has a base material 21 made of the same metal material as a metal material making up the leads 30, such as copper (Cu) or an alloy material containing copper (Cu) as a main component. Each of the plurality of leads 30 has a base material 31 made of the same metal material as a metal material making up the die pad 20, such as copper (Cu) or an alloy material containing copper (Cu) as a main component.

The part (outer portion, exposed portion) of the die pad 20 that is exposed from the sealer 40 is covered with the metal film 22. Similarly, the part (outer portion 30X) of the lead 30 that is exposed from the sealer 40 is covered with a metal film 32. These metal films 22 and 32 are metal films that are for improving the wetness of the solder material used as a connection material in the mounting of the semiconductor device PKG1 on a mounting substrate. The metal films 22 and 32 are, for example, plating metal films formed by an electroplating method. Although described in detail later, each of the metal films 22 and 32 is made of, for example, a solder material containing tin (Sn).

The die bond material (bonding material) 11 shown in FIGS. 5 and 6 is a conductive member (die bond material) for fixing the semiconductor chip 10 onto the die pad 20 and electrically connecting the semiconductor chip 10 to the die pad 20. As the die bond material 11, for example, a solder material maybe used. Alternatively, the die bond material 11 may be a conductive resin adhesive containing a plurality of silver (Ag) particles (Ag filler), which is referred to as so-called silver (Ag) paste. Although not shown in the drawing, note that a metal film (not shown in the drawing) having a larger adhesion property to the die bond material 11 than that of copper (Cu) or a copper alloy that is the base material of the die pad 20 may be formed on a part of the upper surface 20t of the die pad 20. In this manner, the strength of the adhesion between the die bond material 11 and the die pad 20 can be improved.

As shown in FIG. 5, the gate electrode pad GE of the semiconductor chip 10 and the lead 30G are electrically connected to each other via a wire 12 (specifically, wire 12G). Similarly, the source electrode pad SE of the semiconductor chip 10 and the lead 30S are electrically connected to each other via a wire (conductive member, metal line) 12 (specifically, wire 12S). The wire 12 is a conductive member connecting the electrode pad on the front surface 10t side of the semiconductor chip 10 to the lead 30, and has a main component of, for example, aluminum (Al). Note that various modification examples may be applied to the material making up the wire 12, and a metal material such as copper (Cu), silver (Ag), or gold (Au) may be the main component.

As shown in FIG. 5, one end of the wire 12G is bonded to the gate electrode pad GE of the semiconductor chip 10. On the other hand, the other end of the wire 12G, the other end being opposite to the one end, is bonded to an upper surface 30t of a wire bonding portion (lead post, pad, bonding pad, wire connection, bonding portion) 30W, which is formed on a part of the lead 30G.

As shown in FIGS. 5 and 6, one end of the wire 12S is bonded to the source electrode pad SE of the semiconductor chip 10. On the other end, the other end of the wire 12S, the other end being opposite to the one end, is bonded to the upper surface 30t of the wire bonding portion (lead post, pad, bonding pad, wire connection, bonding portion) 30W, which is formed on a part of the lead 30S.

In the power semiconductor device, through a wiring path connected to the source electrode pad SE, a current flows to be larger than a current flowing through a wiring path connected to the gate electrode pad GE. For this reason, in the example shown in FIG. 5, the wire 12S is made thicker than the wire 12G. Note that the shape and the number of the wires 12 are not limited to the aspect in FIG. 5, and various modification examples are applicable. For example, the wire 12G and the wire 12S may be identical to each other in thickness. Alternatively, for example, the source electrode pad SE and the lead 30S may be electrically connected to each other via a plurality of wires 12S. According to the present embodiment, the plurality of wires 12S are connected to the source electrode pad SE of the semiconductor chip 10 although described in detail later. By connecting the plurality of thick wires 12S to the source electrode pad SE as described above, the impedance of the conductive path leading to the source S of FIG. 1 can be reduced.

Figure 7:
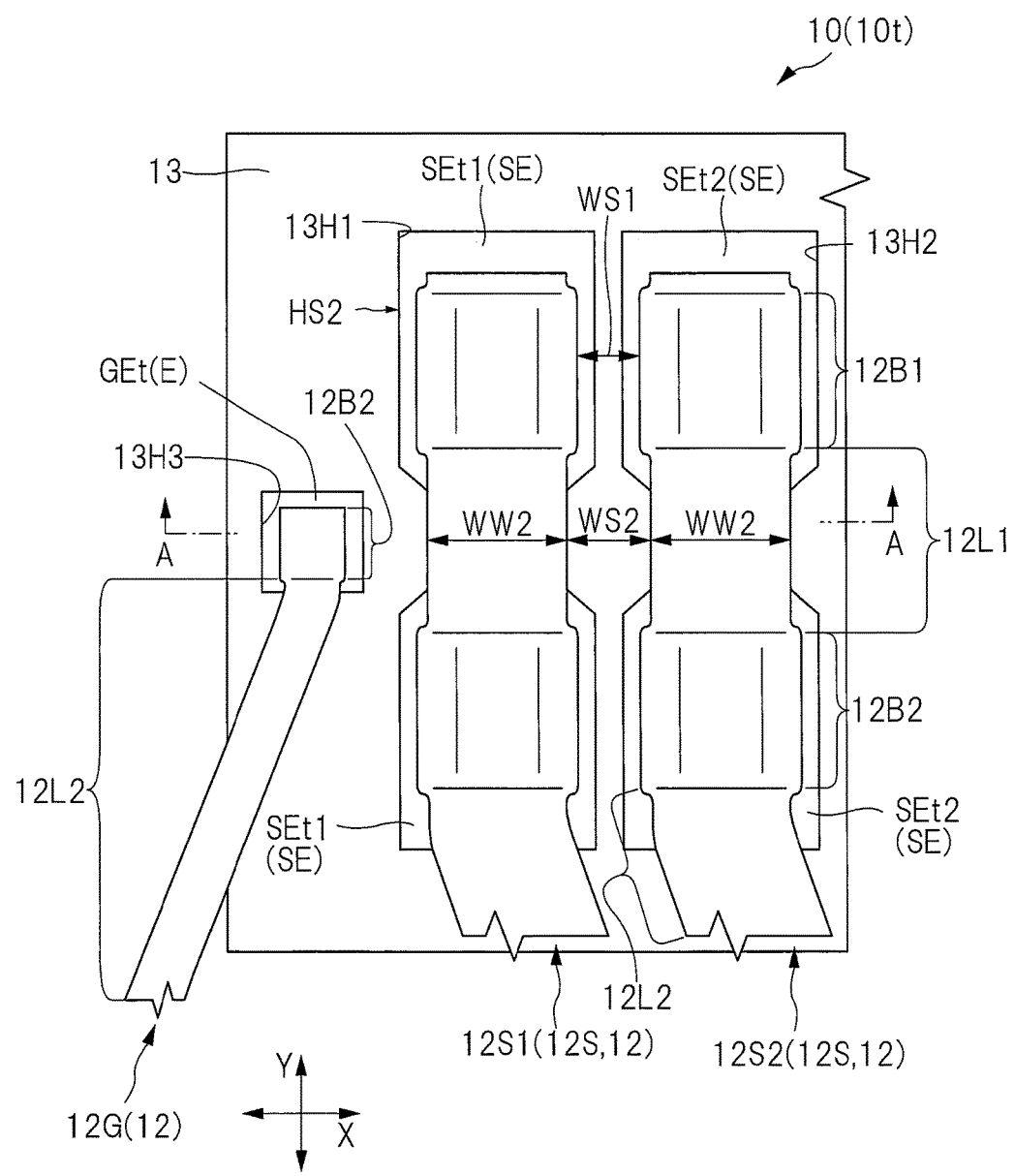
FIG. 7 is an enlarged plan view enlarging and showing a periphery of an upper surface of the semiconductor chip shown in FIG. 5.

The semiconductor chip 10, the plurality of leads 30, and the plurality of wires 12 are sealed with the sealer 40. The sealer 40 is a resin material that seals the semiconductor chip 10 and the plurality of wires 12. Specifically, the sealer 40 is the resin material that seals the semiconductor chip 10 and the plurality of wires 12 so that the sealer is in contact with a bonding surface SEt1 and with a bonding surface SEt2 that are exposed surfaces of the source electrode pad SE as shown in FIG. 7 described later. The sealer 40 has the upper surface 40t (see FIGS. 3 and 6) and the lower surface (mounting surface) 40b (see FIGS. 4 and 6) opposite to the upper surface 40t. As shown in FIGS. 3 and 4, periphery of each of the upper surface 40t (see FIG. 3) and lower surface 40b (see FIG. 4) of the sealer 40 has a plurality of side surfaces 40s. And, the sealer 40 contains an organic insulating material as a main material. For example, the sealer 40 mainly contains a thermosetting resin such as epoxy-based resin. In the present embodiment, in order to improve the characteristics (e.g., expansion characteristics due to thermal influence) of the sealer 40, filler particles such as silica (silicon dioxide: $SiO_2$) particles are mixed into the resin material.

<Details of Connected Parts between Wires and Electrode Pads>

Figure 8:
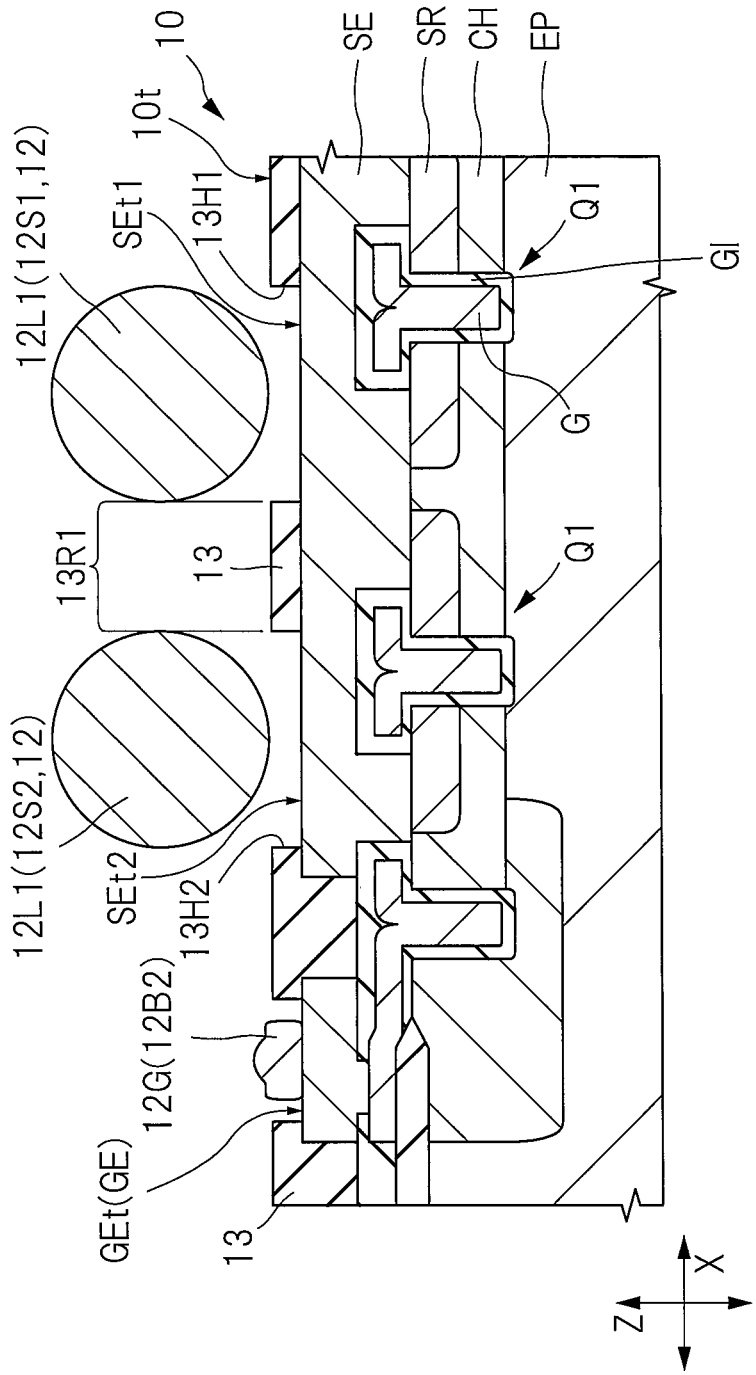
FIG. 8 is an enlarged cross-sectional view taken along a line A-A of FIG. 7.
Figure 9:
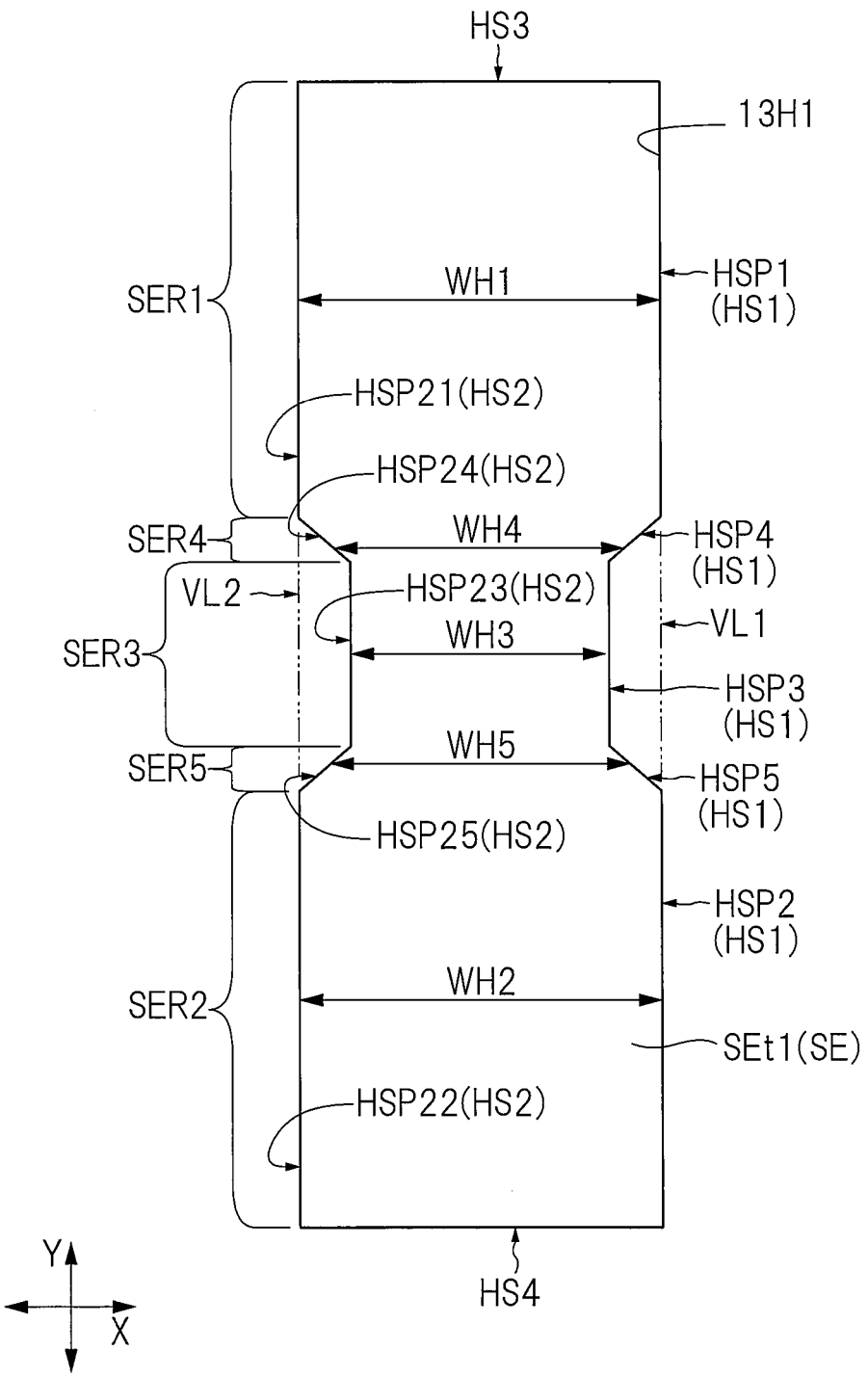
FIG. 9 is an enlarged cross-sectional view of an opening for a source electrode pad shown in FIG. 7.
Figure 10:
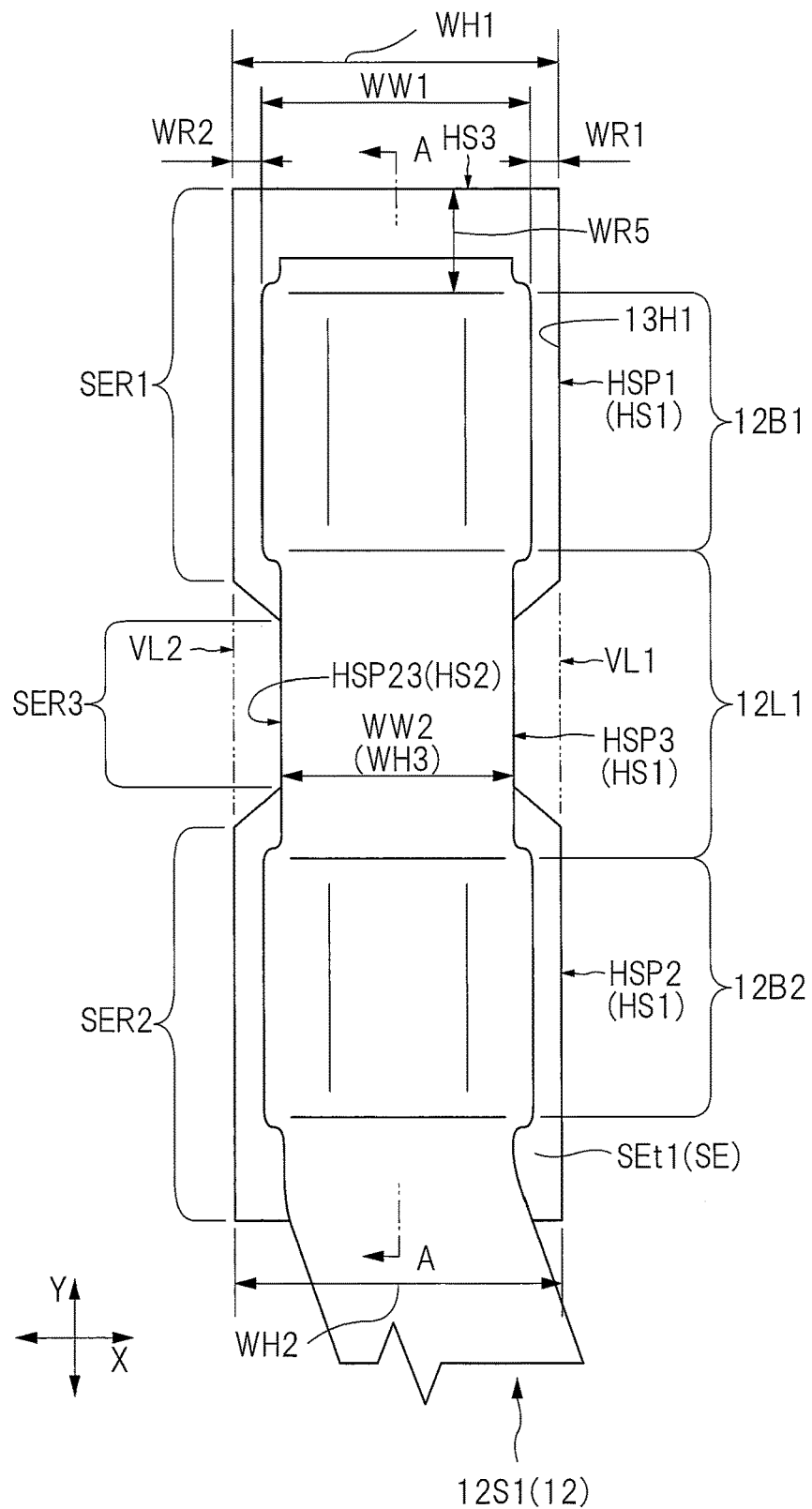
FIG. 10 is an enlarged plan view showing a state in which a source wire is bonded to a bonding surface shown in FIG. 9.
Figure 11:
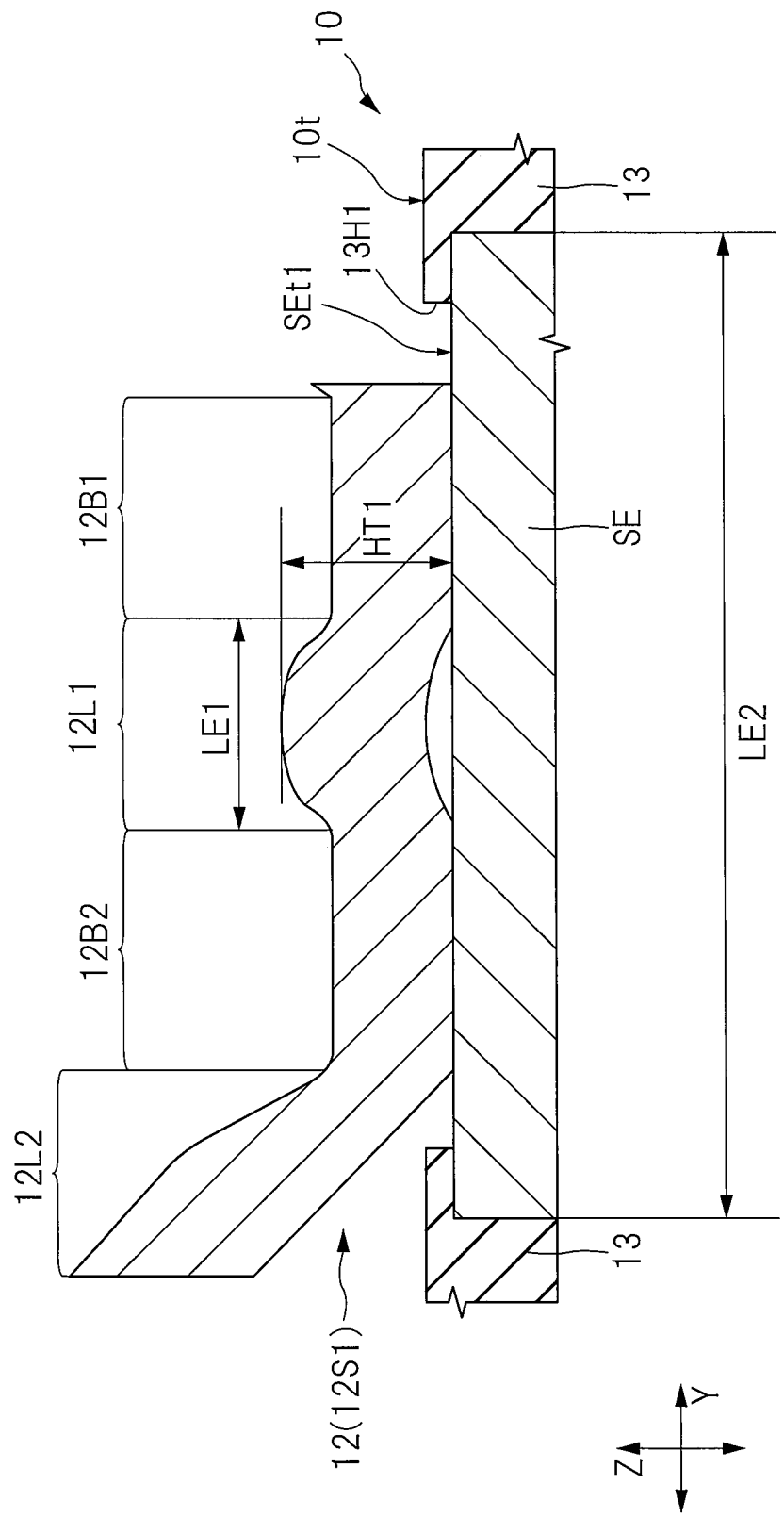
FIG. 11 is an enlarged cross-sectional view taken along a line A-A of FIG. 10.
Figure 12:
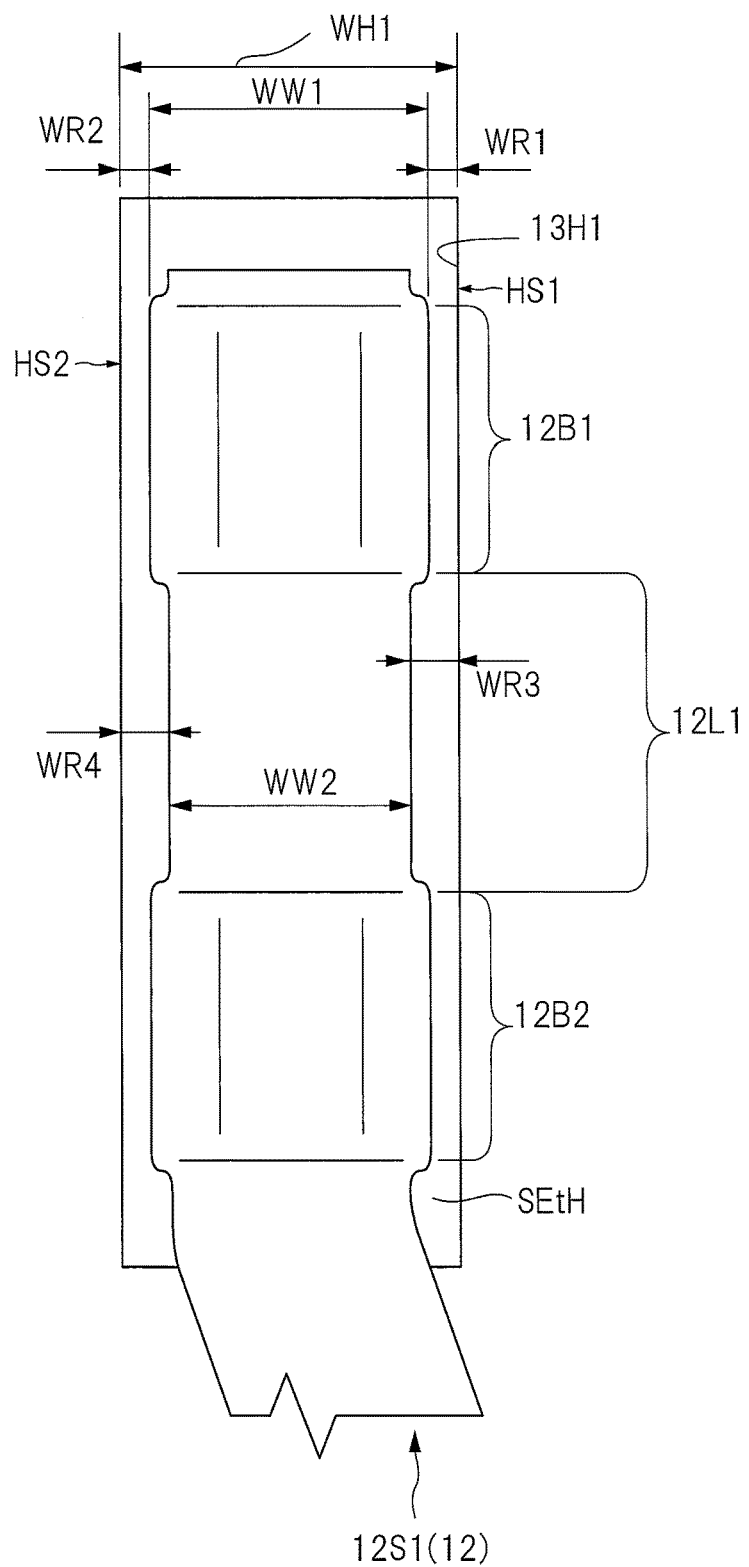
FIG. 12 is an enlarged plan view of a bonding surface according to a study example of FIG. 10.
Figure 13:
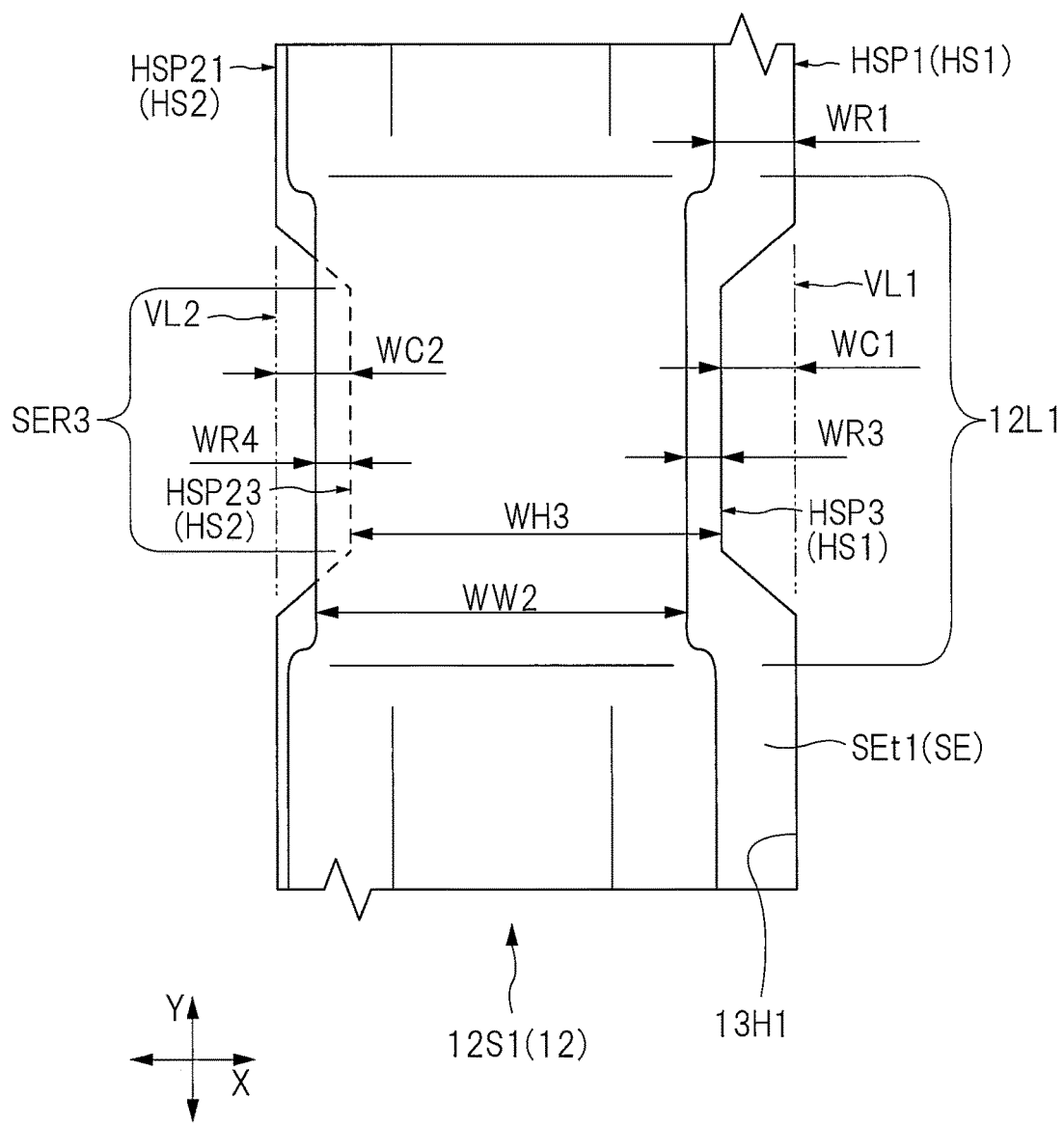
FIG. 13 is an enlarged plan view enlarging and showing a periphery of a loop portion obtained when a bonding position of a wire shown in FIG. 10 is shifted.

Here, the details of a part at which the electrode pad of the semiconductor chip is connected to the wire will be described. FIG. 7 is an enlarged plan view enlarging and showing a part of a plurality of wires connected to the semiconductor chip shown in FIG. 5. FIG. 8 is an enlarged cross-sectional view taken along a line A-A of FIG. 7. FIG. 9 is an enlarged cross-sectional view of an opening for a source electrode pad shown in FIG. 7. FIG. 10 is an enlarged plan view showing a state in which a source wire is bonded to a bonding surface shown in FIG. 9. FIG. 11 is an enlarged cross-sectional view taken along a line A-A of FIG. 10. FIG. 12 is an enlarged plan view of a bonding surface according to a study example of FIG. 10. FIG. 13 is an enlarged plan view enlarging and showing a periphery of a loop portion obtained when a bonding position of a wire shown in FIG. 10 is shifted. In FIG. 8, two transistors Q1 of the large number of transistors Q1 included in the semiconductor chip 10 are representatively shown. And, the plurality of bonding surfaces from each of which a part of the source electrode SE shown in FIG. 5 is exposed have the same structure as one another, and the plurality of wires 12 connected to the bonding surfaces have the same structure as one another. Therefore, in FIGS. 9 and 10, a typical example will be described by suing the bonding surface Set1 and the wire 12S1 connected to the bonding surface Set1 shown in FIG. 7, and repetitive description of the structures of other bonding surfaces (and wires) will be omitted.

As shown in FIG. 7, an insulating film 13 having the front surface 10t is formed on the semiconductor chip 10. The insulating film 13 is a protective film that protects the front surface 10t of the semiconductor chip 10. An upper surface of the insulating film (protective film) 13 forms most of the front surface 10t of the semiconductor chip 10. In the case of the present embodiment, the insulating film 13 is an organic film made of an organic material (organic insulating material) such as a polyimide film. When the insulating film 13 is the organic film, the bonding strength between the insulating film 13 and the sealer 40 (see FIG. 6) containing the organic insulating material as a main component is particularly enhanced. However, composite materials of the insulating film 13 have various modification examples. For example, an organic film other than the polyimide film may be adopted. Alternatively, an inorganic insulating film such as silicon dioxide ($SiO_2$) or silicon nitride (SiN) may be adopted. In consideration of the bonding strength with the sealer 40, an organic film is more preferable than an inorganic insulating film. However, the bonding strength between the inorganic insulating film and the sealer 40 is higher than the bonding strength between a metal material and the sealer 40.

A plurality of openings are formed in the insulating film 13. In an example shown in FIG. 7, openings 13H1, 13H2, and 13H3 are formed in the insulating film 13. From each of the openings 13H1, 13H2, and 13H3, a part of a conductor pattern formed on a lower layer of the insulating film 13 is exposed. Specifically, as shown in FIG. 8, in the opening 13H1, a bonding surface (exposed surface, bonding portion) SEt1, which is a part of the source electrode pad SE, is exposed from the insulating film 13. In the opening 13H2, a bonding surface (exposed surface, bonding portion) SEt2, which is another part of the source electrode pad SE, is exposed from the insulating film 13. In the opening 13H3, a bonding surface GEt, which is a part of the gate electrode pad GE, is exposed from the insulating film 13. Each of the bonding surfaces SEt1, SEt2, and GEt is exposed from the insulating film 13, and therefore, forms a part of the front surface 10t of the semiconductor chip 10.

As shown in FIG. 7, a wire 12 is bonded to each of the bonding surfaces SEt1, SEt2, and Get. Specifically, a wire (source wire) 12S1 is bonded to the bonding surface SEt1, while a wire (source wire) 12S2 is bonded to the bonding surface SEt2. A wire (gate wire) 12G is bonded to the bonding surface GEt. The wire 12S1 of the plurality of wires 12 shown in FIG. 7 is bonded to a plurality of positions (two positions in FIG. 7) of the bonding surface SEt1. In this case, (total value of) a bonding area between the wire 12S1 and the bonding surface SEt1 becomes large, and therefore, an impedance of a supply path for a potential supplied through the wire 12S1 can be reduced.

Specifically, as shown in FIG. 9, the bonding surface SEt1 has a region (bonding region) SER1, a region (bonding region) SER2, and a region (middle region, non-bonding region) SER3 between the region SER1 and the region SER2 in a plan view. As shown in FIG. 10, the wire 12S1 has a bonding portion (connecting portion, stitch portion) 12B1 bonded to the region SER1 of the bonding surface SEt1, a bonding portion (connecting portion, stitch portion) 12B2 bonded to the region SER2 of the bonding surface SEt1, and a loop portion (middle portion) 12L1 located between the bonding portion 12B1 and the bonding portion 12B2 in a plan view.

Each of the bonding portions 12B1 and 12B2 is a part of the wire 12, the part being thermally compression-bonded to the electrode pad of the semiconductor chip 10, and each lower surface of the bonding portions 12B1 and 12B2 is bonded to the same (common) bonding surface SEt1. The loop portion 12L1 is a portion that couples the bonding portion 12B1 to the bonding portion 12B2, and is separated from the bonding surface SEt1 (see FIG. 8). The wire 12S1 has a bonding portion (connecting portion, stitch portion) 12B3 which is a portion bonded to the wire bonding portion 30W of the lead 30 shown in FIG. 5. The wire 12S1 also has a loop portion 12L2 that is located between the bonding portion 12B2 and the bonding portion 12B3 (see FIG. 5) as shown in FIG. 7 and that couples the bonding portion 12B2 to the bonding portion 12B3.

Each of the four bonding surfaces from which the parts of the source electrode pad SE shown in FIG. 5 are exposed has the same structure as that of the bonding surface SEt1 shown in FIGS. 9 and 10. Each of the four wires 12 bonded to the four bonding surfaces from which the source electrode pad SE is exposed has the same structure as that of the wire 12S1 shown in FIG. 10.

The wire 12G connected to the gate electrode pad GE of the plurality of wires 12 shown in FIG. 7 is different in a structure from the wires 12S1 and 12S2. That is, the wire 12G is bonded to one bonding surface GEt at one position. Specifically, the wire 12G has a bonding portion (connecting portion, stitch portion) 12B2 bonded to the bonding surface GEt, a bonding portion (connecting portion, stitch portion) 12B3 (see FIG. 5) bonded to the wire bonding portion 30W (see FIG. 5) of the lead 30 (see FIG. 5), and a loop portion 12L2 located between the bonding portion 12B2 and the connecting portion 12B3. However, the wire 12G does not have the portions corresponding to the bonding portion 12B1 and loop portion 12L1 of the wire 12S1. To the wire 12G, a signal (gate signal) for controlling the switching operation of the transistor Q1 (see FIG. 1) is transmitted. A transmission path through the wire 12G has a relatively smaller influence on a performance of a switching circuit than a transmission path through the wire 12S1 even if the impedance of the transmission path is large. For this reason, the wire 12G is bonded to one bonding surface GEt at one position. By simplification of the structure of the connected part between the wire 12G and the semiconductor chip 10, a manufacturing process can be simplified.

As shown in FIG. 8, in the present embodiment, each of the bonding surfaces SEt1 and SEt2 is a part of one source electrode pad SE covered with the insulating film 13. In other words, the bonding surface SEt1 is a first part of the source electrode pad SE, while the bonding surface SEt2 is a second part of the source electrode pad SE. For connection of a plurality of wires 12 to one source electrode pad SE, for example, a method of bonding both of the wire 12S1 and wire 12S2 to the bonding surface SEt1 exposed from one opening 13H1 by increasing an opening area of the opening 13H1 is considered. In this case, a margin (allowable range) for a positional shift caused when the wire 12 is bonded to the bonding surface SEt1 can be large.

However, according to the studies of the inventors of the present application, it has been found that the peeling off occurs at the bonding interface between the sealer 40 and the source electrode pad SE because of the low bonding strength between the sealer 40 (see FIG. 6) which contains the organic-based material as a main component and the source electrode pad SE which contains the metal material (e.g., aluminum) as a main component. In addition, since a difference in a linear expansion coefficient between the sealer 40 and the source electrode pad SE is large, the peeling off is easily caused by change in a temperature applied to a package obtained after the sealer 40 is formed. As described above, in the sealer 40, the filler particles such as silica particles are mixed into the resin material. Therefore, a linear expansion coefficient as much as the linear expansion coefficient of silicon (Si) making up the semiconductor substrate can be adopted. However, this case also has the large difference in the linear expansion coefficient from the source electrode pad SE made of the metal material, and therefore, the above-described peeling off tends to occur.

Even if the sealer 40 peels off from the source electrode pad SE, the function of the semiconductor device PKG1 (see FIG. 6) is not immediately damaged. However, in consideration of a long-term product quality such as the service life of the semiconductor device PKG1, it is preferable to suppress the peeling off n between the source electrode pad SE and the sealer 40.

As described above, the peeling off at the bonding interface between the insulating film 13 and the sealer 40 is more difficult to occur than the peeling off at the bonding interface between the source electrode pad SE that is the metal film and the sealer 40. For example, when the insulating film 13 is made of polyimide which is an organic material, an adhesive property with the sealer 40 is high, so that the bonding strength can be improved. Also when the insulating film 13 is made of an inorganic insulating film made of silicon oxide, silicon nitride, etc., as a modification example, the adhesive property with the sealer 40 can be higher than that in a case of the metal film. When the material of the insulating film 13 is an inorganic insulating film made of silicon dioxide, silicon nitride, etc., a difference in the linear expansion coefficient from the sealer 40 can be reduced, and therefore, the above-described peeling off is difficult to occur.

In the above-described manner, it is preferable to reduce an area of apart of the source electrode pad SE, the part being exposed from the insulating film 13, from the viewpoint of suppressing the peeling off between the sealer 40 and the source electrode pad SE.

According to the studies of the inventions of the present application, it has been found out that, when the plurality of wires 12 are arranged at a high density as shown in FIG. 7, the peeling off is easy to occur between the adjacent wires 12. In the present embodiment, a plurality of wires 12S each having a larger wire diameter than that of the wire 12G are connected to the source electrode pad SE at a high density from the viewpoint of the improvement of the electrical characteristics of the transmission path which is electrically connected to the source electrode pad SE. By the connection of the plurality of wires 12S each having the large wire diameter, a cross-sectional area of the transmission path which is electrically connected to the source electrode pad SE can be increased, and therefore, the impedance component can be decreased.

For example, the example shown in FIG. 5 exemplifies the connection of the four wires 12S with reference to the area of the front surface 10t of the semiconductor chip 10. However, the number of the wires 12S is not limited to four but maybe smaller than four or equal to or larger than five. And, in the example shown in FIG. 7, each wire diameter of the wires 12S1 and 12S2 is 500 μm. A center-to-center distance between the adjacent wires 12S1 and 12S2 in the X direction is 850 μm. Each width WW2 of the wires 12S1 and 12S2 (a length of the wire 12 in the X direction) of the loop portion 12L1 is equal to the wire diameter of each of the wires 12S1 and 12S2, and is 500 μm. Each width WW1 (see FIG. 10) of the wires 12S1 and 12S2 (a length of the wire 12 in the X direction) of the bonding portions 12B1 and 12B2 is about 600 μm. Therefore, a separation distance between the wires 12S1 and 12S2 which are adjacent to each other is 150 μm (corresponding to a distance WS1 between the adjacent bonding portions 12B1) to 350 μm (corresponding to a distance WS2 between the adjacent loop portions 12L1). In other words, the separation distance between the adjacent wires 12S1 and 12S2 is smaller than the wire diameter of the wire 12S1.

The sealer 40 shown in FIG. 6 is formed by supplying a softened resin material, and sealing the semiconductor chip 10, the wire 12, and a part (inner portion 30M) of the lead 30, and then, curing the resin material. At this stage, when the plurality of wires 12 are arranged at a narrow pitch as shown in FIG. 7, a force applied between the adjacent wires 12 in the supply of the raw material resin of the sealer 40 is smaller than a force applied to a different portion (such as a portion of the front surface 10t of the semiconductor chip 10, the portion being not covered with the wire 12). Therefore, in the region between the adjacent wires 12, the adhesion strength between the sealer 40 and the semiconductor chip 10 is weaker than that in a different region. Therefore, particularly in the region between the adjacent wires 12, the peeling off is easier to occur than in a different region.

According to the studies of the inventors of the present application, it has been found out that, when an X-direction length (width) of a portion between the adjacent wires 12 at which the source electrode pad SE is exposed from the insulating film 13 is equal to or larger than 150 μm, the peeling off between the sealer 40 (see FIG. 6) and the bonding surface SEt1 is particularly easy to occur. Accordingly, the inventors of the present application have studied on a technique for reducing the exposed area of the bonding surface between the adjacent wires 12. Note that "the X-direction length (width) of the portion between the adjacent wires 12 at which the source electrode pad SE is exposed from the insulating film 13" means an X-direction length of a portion in a certain region between the adjacent wires 12S shown in FIG. 7, the portion being not covered with the insulating film 13. For example, in the opening 13H1 shown in FIG. 10, a length WR1 from the bonding portion 12B1 of the wire 12S1 to a portion HSP1 of a side HS1 of the opening 13H1 corresponds to "the X-direction length (width) of the portion between the adjacent wires 12 at which the source electrode pad SE is exposed from the insulating film 13". And, in the opening 13H2 (see FIG. 7), a length WR2 from the bonding portion 12B1 of the wire 12S2 (see FIG. 7) to a portion HSP21 of a side HS2 of the opening 13H2 corresponds to "the X-direction length (width) of the portion between the adjacent wires 12 at which the source electrode pad SE is exposed from the insulating film 13".

First, as shown in FIG. 12 as a study example, the inventors have studied on a case of a small X-direction width in a bonding surface SEtH having a rectangular opening shape. Between FIGS. 10 and 12, a dimension of the wire 12S1 is the same. That is, the width WW2 of the wire 12S1 in the loop portion 12L1 in the X direction (that is the length of the wire 12S1 in the X direction) is 500 μm. The width WW1 of the wire 12S1 in each of the bonding portions 12B1 and 12B2 (that is the length of the wire 12S1 in the X direction) is about 600 μm. A width WH1 of the bonding surface SEtH in the X direction (in other words, an opening width of the opening 13H1) is 700 μm.

In the X direction in a plan view, a peripheral portion of the bonding surface SEtH shown in FIG. 12 has a side (portion) HS1 on one end of the opening 13H1 and a side (portion) HS2 on an opposite end of the side HS1. As shown in the example of FIG. 12, the bonding portion 12B1 is bonded to a center of the bonding surface SEtH in the X direction, each of the width WR1 between the side HS1 and the bonding portion 12B1 (that is the length of the exposed surface of the bonding surface SEtH in the X direction) and the width WR2 between the side HS2 and the bonding portion 12B1 (that is the length of the exposed surface of the bonding surface SEtH in the X direction) is 50 μm. Although the repetitive description is omitted, relations between the bonding portion 12B2 and the sides HS1, HS2 in FIG. 12 are the same as above. And, in the case of the example shown in FIG. 12, each of the width WR3 between the side HS1 and the loop portion 12L1 (that is the length of the exposed surface of the bonding surface SEtH in the X direction) and the width WR4 between the side HS2 and the loop portion 12L1 (that is the length of the exposed surface of the bonding surface SEtH in the X direction) is 100 μm.

If the wire 12S1 can be bonded to the center of the bonding surface SEtH in the X direction as shown in FIG.

12, both widths of the portions at which the bonding surface SEtH is exposed from the insulating film 13 and the wire 12S1 are smaller than 150 μm. Therefore, the above-described peeling off between the sealer 40 (see FIG. 6) and the bonding surface SEtH is difficult to occur. However, when the wire 12S1 is bonded to the bonding surface SEtH, the positional shift occurs in some cases. Therefore, from the viewpoint of the stable bonding of the wire 12S1, about 50 μm is required for a margin (allowable range) for the positional shift.

In the example shown in FIG. 12, when the connection position of the wire 12S1 shifts by 50 μm toward the side HS1 or the side HS2, either the width WR3 or the width WR4 becomes 150 μm. In this case, it has been found out that the peeling off between the sealer 40 (see FIG. 6) and the bonding surface SEtH appears between the adjacent wires 12. On the other hand, when the width WH1 of the bonding surface SEtH is smaller than 700 μm in order to reduce the widths WR3 and WR4, the margin in the wire bonding is small. As a result, depending on how the positional shift in the wire bonding is, a possibility of overlap of a part of the bonding portion 12B1 or the bonding portion 12B2 with the insulating film 13 (see FIG. 7) is caused. The partial overlap of the wire 12S1 with the insulating film 13 causes the reduction in the electrical characteristics of the transmission path.

In the present embodiment, as shown in FIG. 9, a plan shape of the bonding surface SEt1, in other words, an opening shape of the opening 13H1 is not quadrangular. In a plan view, the bonding surface SEt1 has a narrow portion (region SER3) between the region SER1 and the region SER2.

The shape of the bonding surface SEt1 (in other words, the opening 13H1) shown in FIG. 9 can be expressed as follows. In a plan view, a width WH1 of the region SER1 in the X direction and a width WH2 of the region SER2 in the X direction are larger than a width WH3 of the region SER3 in the X direction. In a plan view, the bonding surface SEt1 (opening 13H1) has a side (portion) HS1 on one end of the opening 13H1 in the X direction and a side (portion) HS2 on an opposite end of the side HS1. The bonding surface SEt1 (opening 13H1) has a side (portion) HS3 on one end of the opening 13H1 in the Y direction intersecting (orthogonally in FIG. 9) the X direction and a side (portion) HS4 on an opposite end of the side HS3. Each of the side HS3 and the side HS4 extends in the X direction. Each of the side HS1 and the side HS2 extends in the Y direction so as not to be straight but to bend at a portion between the region SER1 and the region SER3 and a portion between the region SER2 and the regions SER3. In other words, the bonding surface SEt1 has narrow portions on both sides of the side HS1 and the side HS2.

In the example shown in FIG. 9, each of the width WH1 of the region SER1 and the width WH2 of the region SER2 in the X direction is 700 μm. On the other hand, the width WH3 of the region SER3 is 500 μm.

The shape of the bonding surface SEt1 (opening 13H1) shown in FIG. 9 can be expressed as follows. In a plan view, the side HS1 of the bonding surface SEt1 (opening 13H1) has a portion HSP1 extending in the Y direction, a portion HSP2 extending in the Y direction, and a portion HSP3 positioned between the portion HSP1 and the portion HSP2 and extending in the Y direction. As shown in FIG. 10, in a plan view, the bonding portion 12B1 is positioned between the portion HSP1 of the side HS1 and the side HS2 in the X direction. In a plan view, the bonding portion 12B2 is positioned between the portion HSP2 of the side HS1 and the side HS2 in the X direction. And, as shown in FIG. 10, in a plan view, the loop portion 12L1 is positioned between the portion HSP3 of the side HS1 and the side HS2 in the X direction. And, in a plan view, each of an X-direction length (width WH1) from the portion HSP1 of the side HS1 to the side HS2 and an X-direction length (width WH2) from the portion HSP2 of the side HS1 to the side HS2 is larger than an X-direction length (width WH3) from the portion HSP3 to the side HS2.

In the example shown in FIG. 10, in a plan view, the portion HSP1 of the side HS1 and a portion HSP2 of the same are on the same extension line VL1. In other words, the portion HSP2 of the side HS1 is on the extension line VL1 of the portion HSP1. The portion HSP3 of the side HS1 is between the extension line VL1 of the portion HSP1 and the side HS2. In a plan view, a portion HSP21 of the side HS2 and a portion HSP22 of the same are on the same extension line VL2. In other words, the portion HSP22 of the side HS2 is on the extension line VL2 of the portion HSP21. A portion HSP23 of the side HS2 is between the extension line VL2 of the portion HSP21 and the side HS1.

When the bonding portion 12B1 is bonded to the center of the bonding surface SEt1 in the X direction as shown in FIG. 10, each of the width WR1 between the bonding portion 12B1 and the side HS1 (that is the length of the exposed surface of the bonding surface SEt1 in the X direction) and the width WR2 between the bonding portion 12B1 and the side HS1 (that is the length of the exposed surface of the bonding surface SEt1 in the X direction) is 50 μm. Although repetitive description is omitted, relations between the bonding portion 12B2 and the sides HS1, HS2 in FIG. 10 are the same as above. In the example shown in FIG. 10, each of the width between the loop portion 12L1 and the side HS1 (that is the length of the exposed surface of the bonding surface SEt1 in the X direction) and the width between the loop portion 12L1 and the side HS2 (that is the length of the exposed surface of the bonding surface SEt1 in the X direction) is 0 μm.

Therefore, if the connecting position of the wire 12S1 shifts by 50 μm toward the side HS1 in the example shown in FIG. 10, the width between the loop portion 12L1 and the side HS1 in the X direction (that is the length of the exposed surface of the bonding surface SEt1 in the X direction) is 50 μm. That is, when the margin for the positioning accuracy of the wire bonding in the X direction is set to 50 μm, the length of the exposed surface of the bonding surface SEt1 in the X direction is equal to or smaller than 50 μm, and therefore, the peeling off between the sealer 40 (see FIG. 6) and the bonding surface SEt1 can be suppressed. And, when the margin for the positioning accuracy of the wire bonding in the X direction is set to 50 μm, overlap of a part of each of the bonding portions 12B1 and 12B2 of the wire 12S1 with the insulating film 13 (see FIG. 7) can be suppressed.

In the example shown in FIG. 9, note that the bonding surface SEt1 (opening portion 13H1) has a region SER4 between the region SER3 and the region SER1. And, the bonding surface SEt1 (opening portion 13H1) has a region SER5 between the region SER3 and the region SER2. In the regions SER4 and SER5, each of the width (length) WH4 and WH5 in the X direction is not constant. A value of the width WH4 in the region SER4 is smaller as a portion of the region is closer to the region SER3, and is larger as the portion is closer to the region SER1. And, a value of the width WH4 in the region SER5 is smaller as a portion of the region is closer to the region SER3, and larger as the portion is closer to the region SER2.

In the example shown in FIG. 9, the side HS1 has a portion HSP4 positioned between the portion HSP3 and the portion HSP1 and extending in a direction (third direction) intersecting the Y and X directions in a plan view. The side HS1 has a portion HSP5 positioned between the portion HSP3 and the portion HSP2 and extending in a direction (fourth direction) intersecting the Y and X directions. In a plan view, the side HS2 of the bonding surface SEt1 (opening 13H1) has a portion HSP21 extending in the Y direction, a portion HSP22 extending in the Y direction, and a portion HSP23 positioned between the portion HSP21 and the portion HSP22 and extending in the Y direction. The side HS2 has a portion HSP24 positioned between the portion HSP23 and the portion HSP21 and extending in a direction (fifth direction) intersecting the Y and X directions in a plan view. The side HS2 has a portion HSP25 positioned between the portion HSP23 and the portion HSP21 and extending in a direction (fifth direction) intersecting the Y and X directions in a plan view.

However, as a modification example, there are no regions SER4 and SER5 in some cases. In these cases, each of the portions HSP4 and HSP5 of the side HS1 and the portions HSP24 and HSP25 of the side HS2 shown in FIG. 9 extends in the X direction.

In the example shown in FIG. 9, the X-direction width WH3 of the region SER3 is set to 500 µm. As described above, when an X-direction length (width) of a portion between the adjacent wires 12 shown in FIG. 7, the portion at which the source electrode pad SE is exposed from the insulating film 13, is equal to or larger than 150 µm, the peeling off between the sealer 40 (see FIG. 6) and the bonding surface SEt1 is particularly easy to occur. Therefore, when the margin for the positioning accuracy of the wire bonding in the X direction is set to 50 µm, if the width WH3 is smaller than 700 µm, the X-direction width of the portion at which the bonding surface SEt1 is exposed is smaller than 150 µm even in consideration of the positional shift.

However, from the viewpoint of the secure suppression of the occurrence of the peeling off in the region SER3 shown in FIG. 9, the value of the width WH3 is preferably small. For example, as shown in FIG. 13, a case in which the bonding position of the wire 12S1 is close to the side HS2 of the opening 13H1 is assumed. In the example shown in FIG. 13, the bonding position of the wire 12S1 shifts by about 40 µm toward the side HS2 in the X direction. In this case, a portion on which the influence of the above-described peeling off is to be taken into account in the bonding surface SEt1 is a portion between the side HS1 of the opening 13H1 and the wire 12S1 in the bonding surface SEt1. The width WR1 between the portion HSP1 of the side HS1 and the bonding portion 12B1 of the wire 12S1 (see FIG. 10) is about 90 µm. In the example shown in FIG. 13, a width (length) WC1 between the extension line VL1 of the portion HSP1 and the portion HSP3 is 100 µm. Therefore, the width (length) WR3 between the portion HSP3 of the side HS1 and the loop portion 12L1 of the wire 12S1 is about 40 µm. In this case, in the region SER3, the above-described peeling off is more difficult to occur than in the regions SER1 and SER2 shown in FIG. 9.

In this manner, from the viewpoint of the reduction in the occurrence ratio of the peeling off in the region SER3, the width WC1 between the extension line VL1 of the portion HSP1 and the portion HSP3 is preferably larger than the width WR3 between the portion HSP3 of the side HS1 and the loop portion 12L1 of the wire 12S1. Similarly, from the viewpoint of the reduction in the occurrence ratio of the peeling off in the region SER3, a width WC2 between the extension line VL2 of the portion HSP21 of the side HS2 and the portion HSP23 is preferably larger than the width WR4 between the portion HSP23 of the side HS2 and the loop portion 12L1 of the wire 12S1.

Note that the positions of one side of the loop portion 12L1 and the portion HSP3 of the opening 13H1 overlap each other in the example shown in FIG. 10, and therefore, the value of the width WR3 shown in FIG. 13 is 0 µm.

As described above, the peeling off between the sealer 40 shown in FIG. 6 and the bonding surface SEt1 is easy to occur between the adjacent wires 12. Therefore, even if the exposed surface of the bonding surface SEt1 between the wire 12S1 shown in FIG. 10 and the side HS3 of the opening 13H1 is large, the above-described peeling off is difficult to occur. Therefore, in the example shown in FIG. 10, the width WR5 between the side HS3 and the bonding portion 12B1 in the Y direction (that is the length of the exposed surface of the bonding surface SEtH in the Y direction) is larger than the width WR1 between the side HS1 and the bonding portion 12B1 in the X direction (that is the length of the exposed surface of the bonding surface SEtH in the X direction). The width WR5 is larger than the width WR2 between the side HS2 and the bonding portion 12B1 in the X direction (that is the length of the exposed surface of the bonding surface SEtH in the X direction). In the example shown in FIG. 10, note that the width WR1 between the side HS1 and the bonding portion 12B1 in the X direction is 50 µm. In the example shown in FIG. 13, the width WR1 is about 90 µm. On the other hand, the value of the width WR5 shown in FIG. 10 is about 150 µm to 200 µm. As shown in FIG. 10, by the increase in the value of the width WR5 at the portion at which the peeling off is difficult to occur, the margin for the positional shift in the wire bonding can be increased, and therefore, the manufacturing conditions in the wire bonding step can be moderate.

Figure 14:
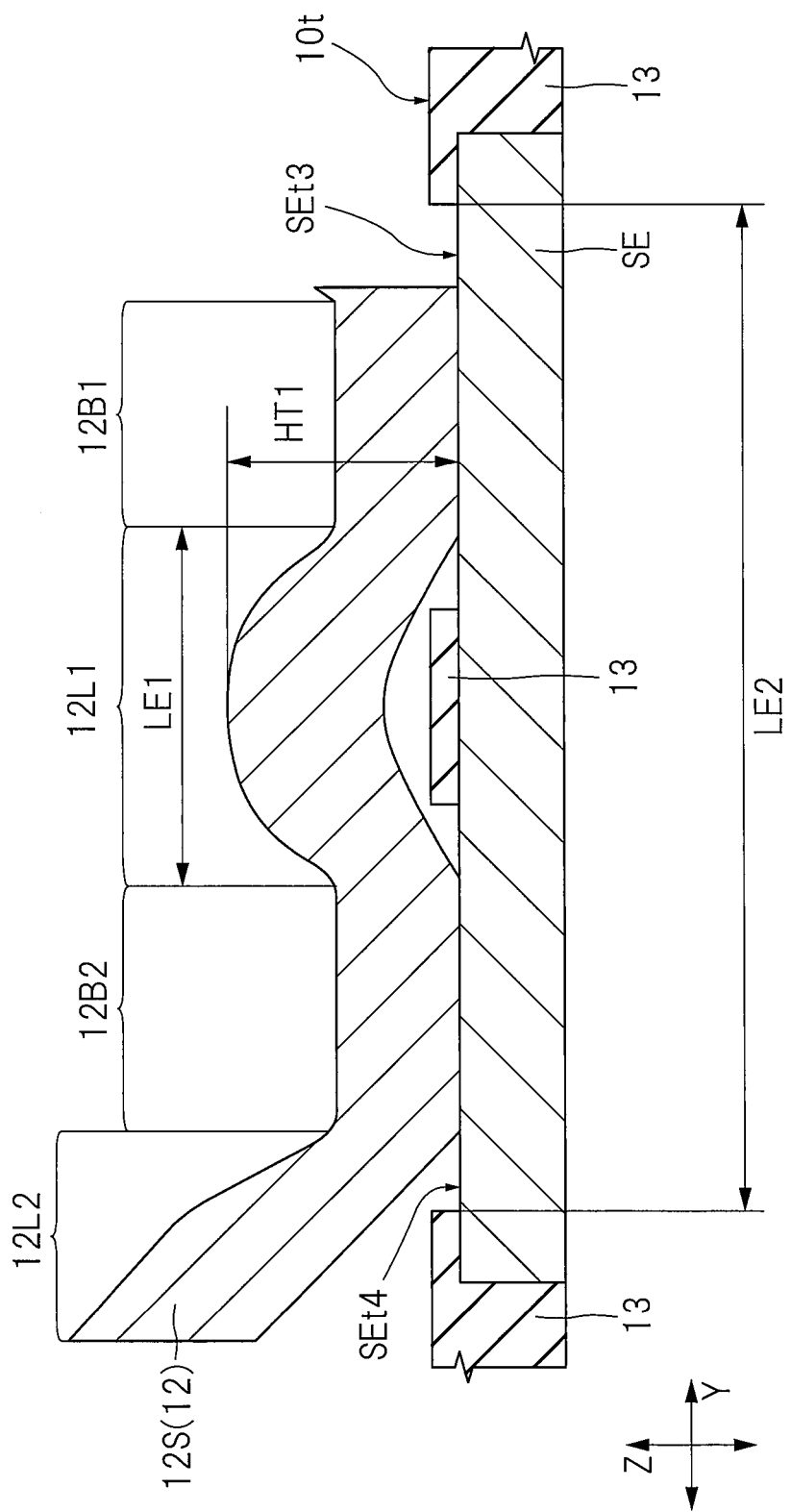
FIG. 14 is an enlarged cross-sectional view showing a study example of FIG. 11.

A structure shown in a study example shown in FIG. 14 can be considered from the viewpoint of the reduction in the exposed area of the source electrode pad SE. FIG. 14 is an enlarged cross-sectional view of a study example of FIG. 11. The study example of FIG. 14 is different from the aspect of FIG. 11 in that one wire 12S is bonded to a bonding surface SEt3 and a bonding surface SEt4 that are separated from each other across the insulating film 13. In other words, in the example shown in FIG. 14, on the front surface 10t of the semiconductor chip 10, the wire 12S is bonded to the source electrode pad SE at two parts, and the bonding surfaces SEt3 and SEt4 to each of which the wire 12S is bonded are separated from each other. On the other hand, in the example shown in FIG. 11, the bonding portion 12B1 and the bonding portion 12B2 of the wire 12S1 are bonded to one bonding surface SEt1 that is not separated across the insulating film 13. In other words, in the example shown in FIG. 14, the loop portion 12L1 of the wire 12S bridges over the insulating film 13 above the source electrode pad SE. On the other hand, in the example shown in FIG. 11, the loop portion 12L1 of the wire 12S1 does not bridge over the insulating film 13 above the source electrode pad SE. In the example shown in FIG. 14, since the bonding surface SEt3 and the bonding surface SEt4 are separated from each other across the insulating film 13 on the front surface 10t, the exposed area of the source electrode pad SE can be smaller than that in the example of the present embodiment shown in FIG. 11.

However, the example shown in FIG. 11 is more preferable in the following points that have been found by the comparison between FIG. 11 and FIG. 14. That is, in the example shown in FIG. 14, it is required to form the loop portion 12L1 of the wire 12S into such a shape as not coming in contact with the insulating film 13. For this reason, when a distance from the exposed surface of the source electrode pad SE to a part of the loop portion 12L1, the part being positioned at the farthest from the exposed surface, is defined as a loop height HT1, the loop height HT1 of the example shown in FIG. 11 can be lower than the loop height HT1 of the example shown in FIG. 14. When a Y-direction length of the loop portion 12L1 (in other words, the distance between the bonding portion 12B1 and the bonding portion 12B2) is defined as a loop length LE1, the loop length LE1 of the example shown in FIG. 11 can be smaller than the loop length LE1 of the example shown in FIG. 14. This is achieved by the fact that the loop height HT1 in the example shown in FIG. 11 can be smaller. If the loop length LE1 can be small, a Y-direction length LE2 of the source electrode pad SE (the length also including that of a part covered with the insulating film 13) can also be small.

Therefore, since the size of the source electrode pad SE in the example shown in FIG. 11 can be made smaller than that in the example shown in FIG. 14, the plane area of the semiconductor chip 10 (the area of the front surface 10t) can be reduced. If the plane area of the semiconductor chip 10 can be small, various advantages can be obtained. For example, the plane area of the semiconductor device PKG1 (see FIG. 5) on which the semiconductor chip 10 is mounted can be small. Further, for example, when a semiconductor chip is manufactured, the number (yield efficiency) of semiconductor chips that can be obtained from one semiconductor wafer is improved, so that a manufacturing efficiency of the semiconductor chip is improved.

A short Y-direction length LE2 of the source electrode pad SE is preferable in the following points. That is, a stress caused by a difference in the linear expansion coefficient between the source electrode pad SE and the sealer 40 increases in proportion to the length of the source electrode pad SE. Therefore, as shown in FIG. 11, according to the present embodiment, the Y-direction length LE2 of the source electrode pad SE can be made small, and therefore, the stress caused by the difference in the linear expansion coefficient between the source electrode pad SE and the sealer 40 can be reduced. As a result, the peeling off between the sealer 40 and the source electrode pad SE, which is caused by such a stress, can be suppressed.

The sealer 40 shown in FIG. 6 is formed so that the sealer is in contact with the bonding surface GEt, which is the exposed surface of the gate electrode pad GE shown in FIG. 7. Therefore, from the viewpoint of suppressing the peeling off between the sealer 40 and the bonding surface GEt, it is preferable to reduce an area of a region of the bonding surface GEt, the region not overlapping the wire 12G. However, in the present embodiment, the wire diameter (diameter) of the wire 12G is smaller than the wire diameter of each of the wires 12S1 and 12S2, and is, for example, about 125 to 150 μm. The wire 12G is bonded to the gate electrode pad GE at one part but is not bonded thereto at other parts. For this reason, the area of the bonding surface GEt of the gate electrode pad GE is smaller than the area of each of the bonding surfaces SEt1 and SEt2 of the source electrode pad SE. For example, in the example shown in FIG. 7, the area of the bonding surface GEt of the gate electrode pad GE is equal to or smaller than one fourth of the area of each of the bonding surfaces SEt1 and SEt2 of the source electrode pad SE. In other words, the area of each of the bonding surfaces SEt1 and SEt2 is equal to or large than four times as large as the area of the bonding surface GEt. In this manner, the bonding surface GEt is sufficiently smaller in the area than the bonding surfaces SEt1 and SEt2 of the source electrode pad SE. Therefore, the bonding surface GEt is more difficult to peel off from the sealer 40 than the bonding surfaces SEt1 and SEt2. Therefore, on the front surface 10t of the semiconductor chip 10, the bonding surfaces SEt1 and SEt2 of the source electrode pad SE has a higher priority than the bonding surface GEt of the gate electrode pad GE in a part for which a measure for preventing the peeling off from the sealer 40 is to be performed.

<Method of Manufacturing Semiconductor Device>

Figure 15:
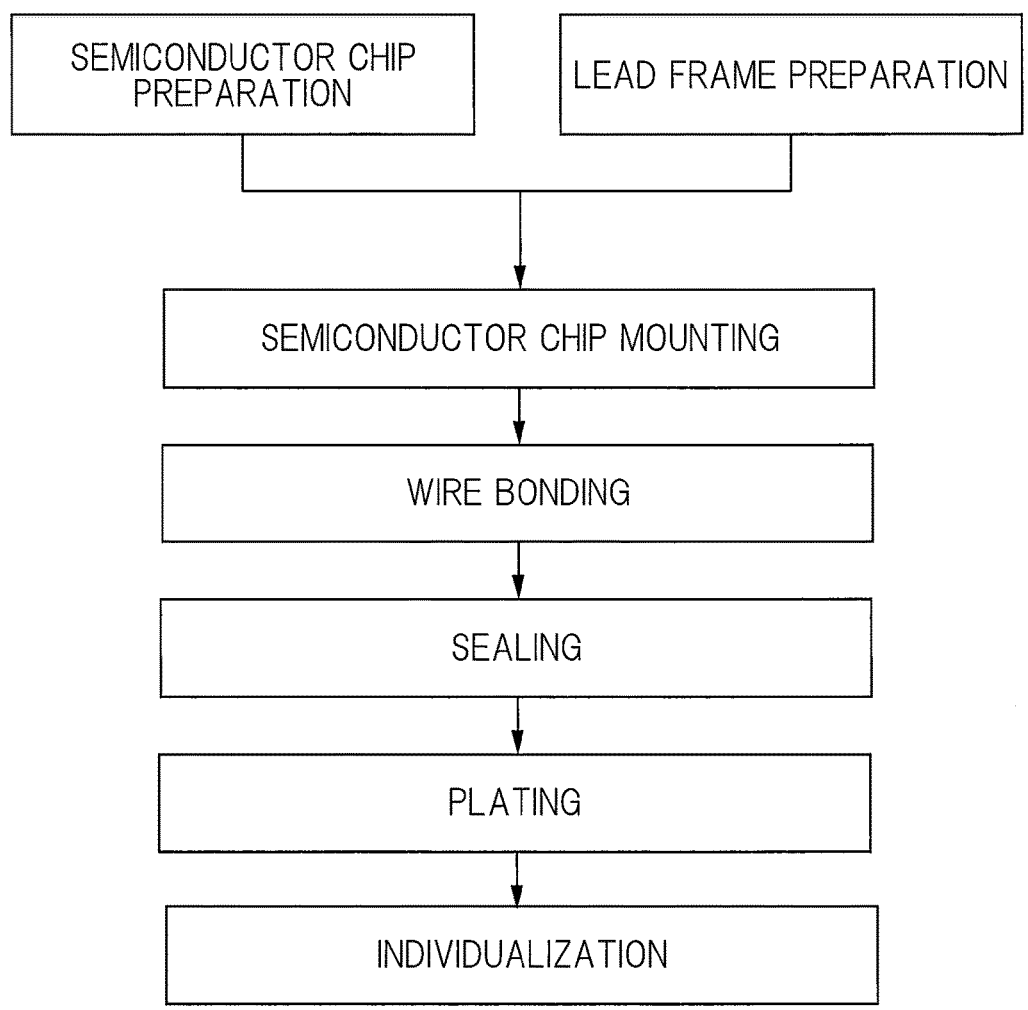
FIG. 15 is an explanatory diagram showing an outline of steps of manufacturing the semiconductor device described with reference to FIGS. 1 to 11.

Next, steps of manufacturing the semiconductor device PKG1 having been described with reference to FIGS. 1 to 11 will be described. The semiconductor device PKG1 is manufactured in accordance with a flow shown in FIG. 15. FIG. 15 is an explanatory diagram showing an outline of the steps of manufacturing the semiconductor device having been described with reference to FIGS. 1 to 11. In the following description, components of the semiconductor device PKG1 will be described with reference to FIGS. 1 to 14 that have been previously described in some cases if needed.

<Semiconductor Chip Preparation Step>

Figure 16:
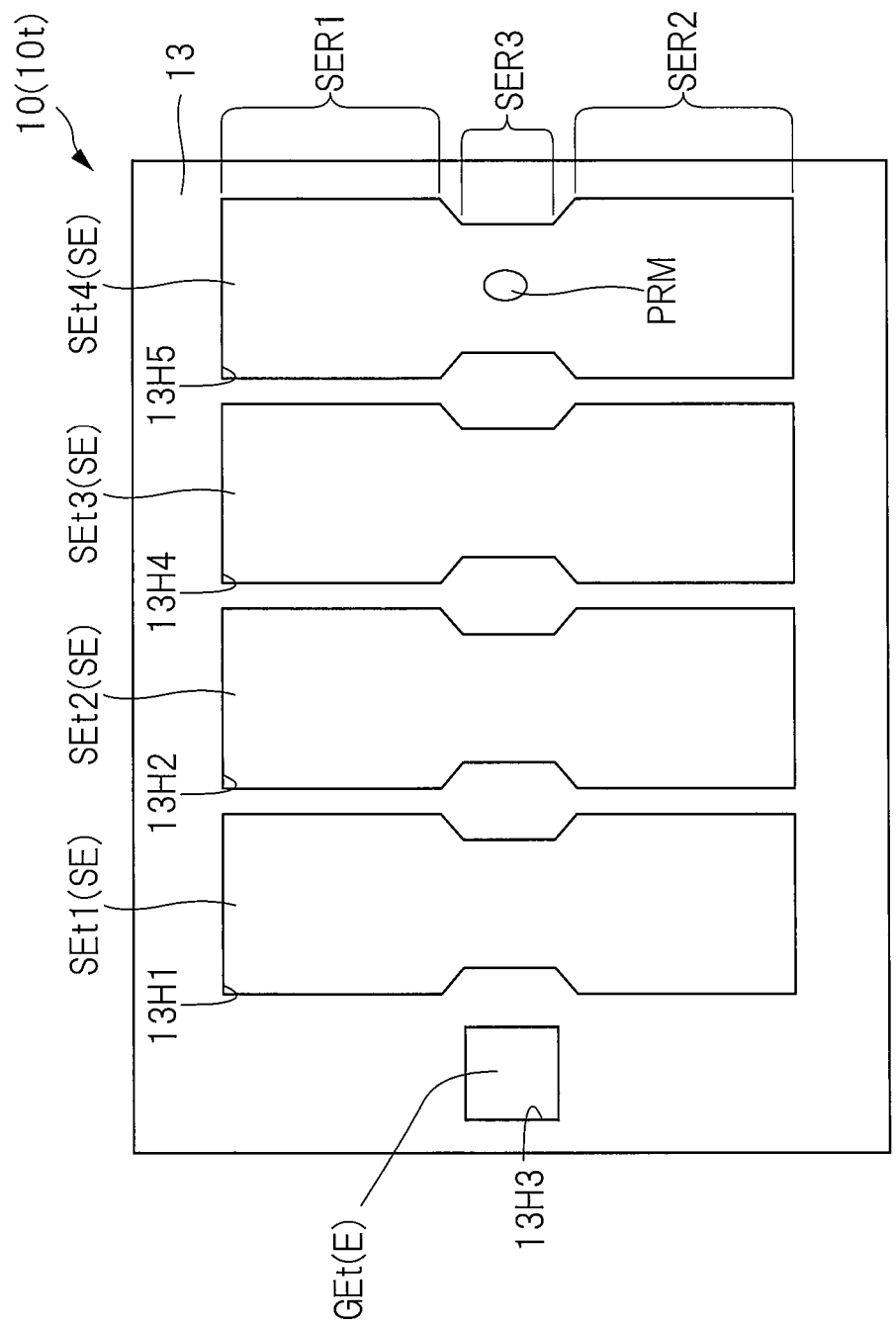
FIG. 16 is a plan view on a front surface (electrode exposed surface) side of a semiconductor chip prepared at a semiconductor chip preparation step shown in FIG. 15.

At a semiconductor chip preparation step shown in FIG. 15, the semiconductor chip 10 shown in FIG. 16 is prepared. FIG. 16 is a plan view showing the front surface (electrode exposed surface) of the semiconductor chip prepared at the semiconductor chip preparation step shown in FIG. 15.

The semiconductor chip 10 prepared at this step includes the front surface 10t and a back surface 10b opposite to the front surface 10t as shown in FIG. 6. As shown in FIG. 16, the front surface 10t of the semiconductor chip 10 includes the upper surface of the insulating film 13 and bonding surfaces (exposed surfaces) SEt1, SEt2, SEt3, and SEt4 of the source electrode pad (electrode) SE exposed from the insulating film 13. The source electrode pad SE has the bonding surface SEt1 exposed from the insulating film 13 at an opening 13H1 formed on the insulating film 13 and the bonding surface SEt2 exposed from the insulating film 13 at an opening 13H2 formed on the insulating film 13. In the example shown in FIG. 16, the source electrode pad SE has the bonding surface SEt3 exposed from the insulating film 13 at an opening 13H4 formed on the insulating film 13 and the bonding surface SEt4 exposed from the insulating film 13 at an opening 13H5 formed on the insulating film 13. Each of the bonding surfaces SEt1, SEt2, SEt3, and SEt4 extends in the Y direction and is arranged so as to be adjacent to each other in the X direction intersecting the Y direction.

On the front surface 10t of the semiconductor chip 10, the gate electrode pad (electrode) GE is also formed. The gate electrode pad GE has the bonding surface GEt that is exposed from the insulating film 13 at the opening 13H3 formed on the insulating film 13. As shown in FIG. 6, on the back surface 10b of the semiconductor chip 10, the drain electrode (electrode) DE that is connected electrically to the drain D (see FIG. 1) is formed. In the example shown in FIG. 6, the whole of the back surface 10b of the semiconductor chip 10 becomes the drain electrode D.

A shape of and a structure of each of the bonding surfaces SEt1, SEt2, SEt3, and SEt4 have been already described with reference to FIG. 9, and therefore, the repetitive description thereof is omitted.

The semiconductor chip 10 of FIG. 16 is manufactured as, for example, follows. A semiconductor wafer (not shown) including an n$^-$-type epitaxial layer EP formed on the main surface WHt (see FIG. 2) of the semiconductor substrate WH (see FIG. 2) made of n-type single crystal silicon is prepared, and a plurality of transistors Q1 are formed on the epitaxial layer EP as shown in FIG. 8. The semiconductor wafer includes a large number of chip regions, and a plurality of transistors Q1 are formed in the plurality of chip regions, respectively. On the transistor Q1, the source electrode pad SE and the gate electrode pad GE are formed. The source electrode pad SE is connected to a plurality of source regions SR, while the gate electrode pad GE is connected to a plurality of gate electrodes G. FIG. 8 shows an example in which the source regions SR are connected directly to the source electrode pad SE. As a modification example, a leading-out wiring (source wiring) may be interposed between the source regions and the source electrode pad SE. Although illustration is omitted in FIG. 8, the gate electrode pad GE is connected to the gate electrodes G via a leading-out wiring (gate wiring) not shown. Subsequently, the insulating film 13 is formed so as to entirely cover the source electrode pad SE and gate electrode pad GE. Then, the openings 13H1, 13H2, 13H3, 13H4, and 13H5 shown in FIG. 16 are formed in the insulating film 13 so that apart (i.e., the bonding surfaces SEt1, SEt2, SEt3, and SEt4) of the source electrode pad SE and a part (i.e., bonding surface GEt) of the gate electrode pad GE are exposed from the insulating film 13. Then, after a necessary test (wafer test), such as electrical test on a circuit, is performed, the wafer is divided into a plurality of semiconductor chips 10. When a metal film is formed on the back surface 10b as the drain electrode DE of FIG. 6, note that the metal film serving as the drain electrode DE is formed at any timing from the step of preparing the semiconductor wafer to the step of dividing the semiconductor wafer. For example, when the thickness of the semiconductor chip 10 is reduced by polishing the back surface of the semiconductor wafer after the formation of the openings 13H1, 13H2, 13H3, 13H4, and 13H5 but before the wafer test, the metal film serving as the drain electrode DE is formed on the back surface 10b (see FIG. 6) after the back surface is polished. When the metal film is not used as the drain electrode DE, this step can be omitted.

In the semiconductor chip preparation step, the wafer test is performed before the semiconductor wafer is divided to obtain the plurality of semiconductor chips 10. This wafer test includes an electrical test for checking the electrical property of the circuit formed in the semiconductor chip 10. In this electrical test, for example, a test terminal (probe) not illustrated is brought into contact with the source electrode pad SE. At this time, when the test terminal is intruded into the source electrode pad SE, a mark (a probe mark PRM shown in FIG. 16) formed by the intrusion of the test terminal is left in the source electrode pad SE.

Each of the bonding surfaces SEt1, SEt2, SEt3, and SEt4 has the regions SER1, SER2, and SER3 as described above. The regions SER1 and SER2 of these regions are regions to which the wire 12 (see FIG. 7) is bonded. In consideration of the connection stability of the wire 12, it is better not to cause surface asperity such as the probe mark PRM in a region to which the wire 12 is bonded. Therefore, as shown in FIG. 16, the probe mark PRM is formed in the region SER3 that is not a region in which the wire connection is not scheduled.

In the example shown in FIG. 16, note that the bonding surfaces SEt1, SEt2, SEt3, and SEt4 are electrically connected to each other, and therefore, an example of the contact of the test terminal to the bonding surface SEt4 is representatively shown. However, the probe mark PRM is formed in all the bonding surfaces SEt1, SEt2, SEt3, and SEt4 in some cases. In these cases, the probe mark RPM is formed in the region SER3 included in each of the bonding surfaces SEt1, SEt2, SEt3, and SEt4.

<Lead Frame Preparation Step>

Figure 17:
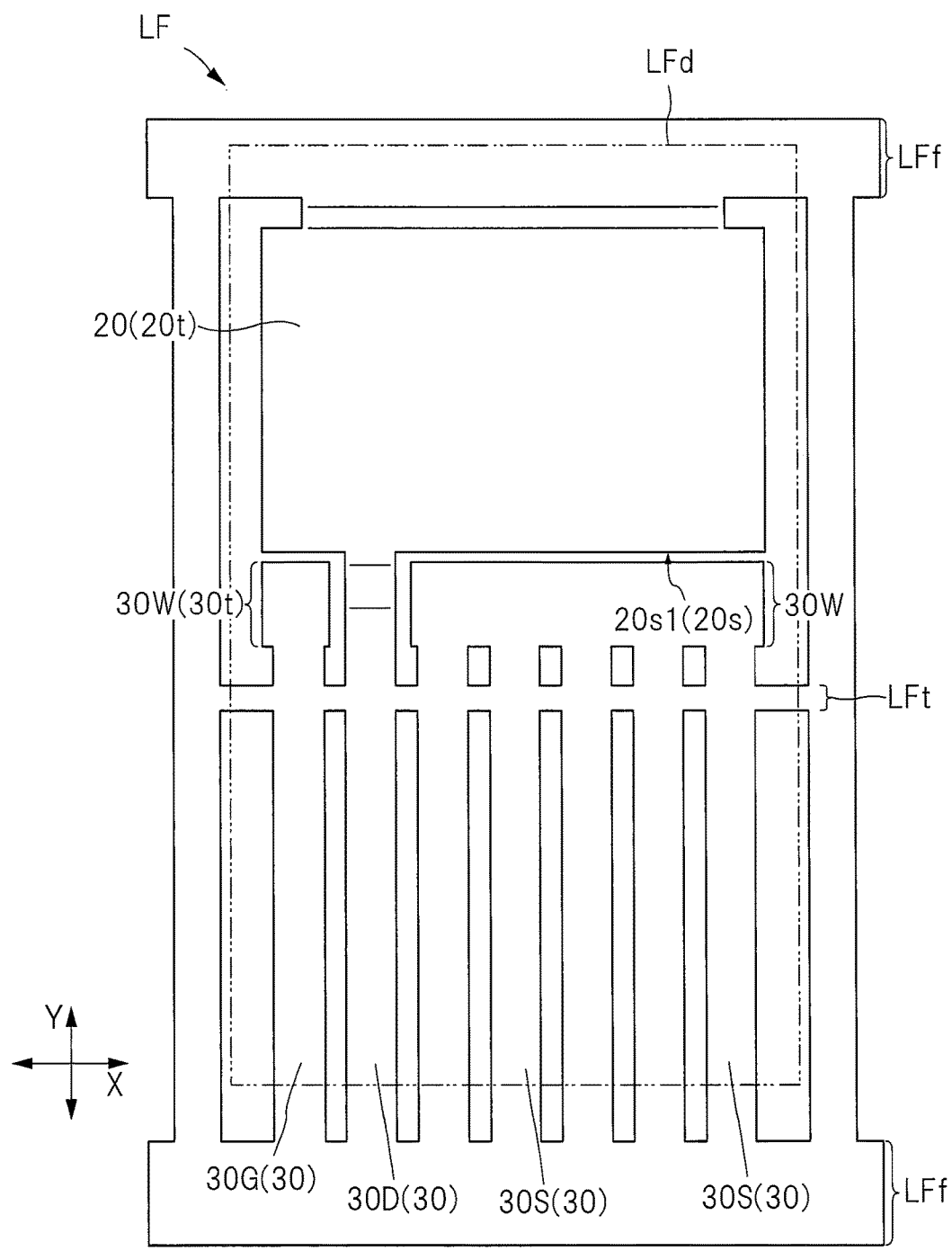
FIG. 17 is an enlarged plan view showing a part of a lead frame prepared at a lead frame preparation step shown in FIG. 15.

At a lead frame preparation step shown in FIG. 15, a lead frame LF shown in FIG. 17 is prepared. FIG. 17 is an enlarged plan view showing a part of the lead frame prepared at the lead frame preparation step of FIG. 15.

As shown in FIG. 17, the lead frame LF prepared at this step has a device formation portion LFd connected to a frame portion LFf. One device formation portion LFd corresponds to one semiconductor device PKG1 shown in FIG. 5. FIG. 17 shows one device formation portion LFd. However, the lead frame LF has a plurality of device formation portions LFd coupled together through the frame portion LFf. In this manner, by using the lead frame LF having the plurality of device formation portions LFd, a plurality of semiconductor devices PKG1 (see FIG. 3) can be collectively manufactured, and therefore, the manufacturing efficiency can be improved.

The lead frame LF is made of a metal material containing, for example, copper (Cu) as a main component, and has a thickness of, for example, about 125 μm to 400 μm. Each of the plurality of device formation portions LFd is connected to the frame portion LFf. The frame portion LFf is a support portion that supports each member formed in the device formation portion LFd until start of a lead separation step shown in FIG. 12.

As shown in FIG. 17, the die pad 20 and the plurality of the leads 30 are formed in the device formation portion LFd. The die pad 20 is coupled to the frame portion LFf via one (lead 30D) of the plurality of leads 30, and is supported by the frame portion LFf. The die pad 20 has the upper surface 20t that is the chip mounting surface.

Each of the plurality of leads 30 is coupled to the frame portion LFf, and is supported by the frame portion LFf. The plurality of leads 30 extend in the Y direction, and are arranged side by side so as to be adjacent to each other in the X direction. The plurality of leads 30 are coupled to each other via a tie bar LFt.

The plurality of leads 30 include the plurality of leads 30S that are the source leads. The plurality of leads 30S are arranged side by side in the X direction so as to be adjacent to each other, and are coupled to the wire bonding portion (lead post, pad, bonding pad, wire connecting portion, bonding portion) 30W. The plurality of leads 30 include also the lead 30G that is the gate lead. The wire bonding portion 30W is provided to a tip of the lead 30G, the tip being closer to the die pad 20. The plurality of leads 30 include also the lead 30D that is the drain lead. The lead 30D is located between the lead 30G and the leads 30S in the X direction, and has a tip closer to the die pad 20 in the Y direction, the tip being coupled to the die pad 20.

According to the present embodiment, the upper surface 20t of the die pad 20 is located at a height different from a height of the upper surface 30t of the wire bonding portion 30W of the lead 30. The lead 30D supporting the die pad 20 and a portion connecting the die pad 20 to the frame portion LFf are bent to offset the die pad 20. According to the present embodiment, the die pad 20 is offset downward from other members of the lead frame LF. As a result, as shown in FIG. 6, the upper surface 20t of the die pad 20 is arranged to be lower than the upper surface 30t of the lead 30. By the downward-offset of the die pad 20 as described above, the lower surface 20b of the die pad 20 is exposed from the sealer 40, as shown in FIG. 6.

<Semiconductor Chip Mounting Step>

Next, at a semiconductor chip mounting step shown in FIG. 15, the semiconductor chip 10 is mounted on the die pad 20 of the lead frame LF as shown in FIG. 5.

At the present step, the semiconductor chip 10 is mounted (adhesively fixed) via the die bond material 11 onto the upper surface 20t of the die pad 20 formed integrally with the lead 30D serving as the drain terminal. The semiconductor chip 10 is adhesively fixed to the upper surface 20t via the die bond material 11 so that the back surface 10b (see FIG. 6) on which the drain electrode DE (see FIG. 6) is mounted is opposite to the upper surface 20t serving as the chip mounting surface of the die pad 20. As a result, the drain electrode DE of the semiconductor chip 10 is connected electrically to the die pad 20 via the die bond material 11, which is a conductive bonding material.

At the present step, after the die bond material 11 is applied to the upper surface 20t of the die pad 20, the semiconductor chip 10 is mounted on the die bond material 11. The die bond material is cured, so that the semiconductor chip 10 and die pad 20 are fixed to each other.

As the die bond material 11, for example, a solder material may be used. Alternatively, as the die bond material 11, a conductive resin adhesive that is a so-called silver (Ag) paste containing a plurality of silver (Ag) particles (Ag filler) may be used. When the die bond material 11 is the solder material, a reflow process is performed as a method of curing the die bond material. When the die bond material 11 is the conductive resin adhesive, a thermosetting resin component contained in the die bond material 11 is heated to be cured.

<Wire Bonding Step>

Next, at a wire bonding step shown in FIG. 15, the plurality of electrode pads (gate electrode pad GE and source electrode pad SE) of the semiconductor chip 10 are connected electrically to the plurality of leads 30 via the wires (metal wires) 12, respectively, as shown in FIG. 5.

As shown in FIG. 5, at the present step, the gate electrode pad GE of the semiconductor chip 10 is connected electrically to the lead 30G via the wire 12G. At the present step, the source electrode pad SE of the semiconductor chip 10 is connected electrically to the leads 30S via the wires 12S. Specifically, the bonding portion 12B2 (see FIG. 7) of the wire 12G is bonded to the bonding surface GEt (see FIG. 7), which is a part of the gate electrode pad GE, and the connecting portion 12B3 of the wire 12G is bonded to the upper surface (bonding surface) 30t of the wire connecting portion 30W of the lead 30G. The connecting portion 12B1 and bonding portion 12B2 of the wire 12S1 (see FIG. 7) are bonded to the bonding surface SEt1 (see FIG. 7), which is a part of the source electrode pad SE, and the connecting portion 12B3 of the wire 12S1 is bonded to the upper surface (bonding surface) 30t of the wire connecting portion 30W of the lead 30S. As similar to the bonding surface SEt1, the wire 12 (see FIG. 5) is bonded to each of the bonding surfaces SEt2, SEt3, and SEt4 shown in FIG. 16.

Various modification examples are applicable to a method of connecting the wire 12. According to the present embodiment, a wire 12 made of aluminum is bonded while using a bonding tool which is called wedge tool although not shown. The following explanation will be made while exemplifying a method of electrically connecting the source electrode pad SE to the lead 30S shown in FIG. 5 via the wire 12S1 shown in FIG. 10 as an example of a wire bonding process using a wedge bonding method.

In the wire bonding step, first, by using the wedge tool, the connecting portion 12B1 of the wire 12S1 shown in FIGS. 10 and 11 is bonded to the region SER1 (see FIG. 10) of the bonding surface SEt1 of the source electrode pad SE, the region being exposed from the opening 13H1 (a first bonding step). In the wedge bonding method, the wire 12S1 is thermally compression-bond to the bonding surface SEt1 by interposing the wire 12S1 between the tip surface of the wedge tool and the bonding surface SEt1 and by applying a pressure and heat from the tip surface. At this time, by applying ultrasonic waves from the tip surface, the wire 12S1 is easily bonded. The wire 12S1 pressed by the wedge tool is deformed and forms the connecting portion 12B1. The connecting portion 12B1 formed by deforming the wire with a circular cross section as described above is referred to as stitch portion.

Next, in the wire bonding step, the wedge tool is moved away from the bonding surface SEt1 shown in FIGS. 10 and 11, and then, is moved in the Y direction to form the loop portion 12L1 (first loop formation step). At the present step, the wedge tool moves to be upper than the lead frame LF while feeding the wire 12S1, so that the wedge tool and the semiconductor chip 10 are away from each other. Then, the wedge tool is moved in the Y direction toward a region to which the second bonding is performed, and then, the wedge tool is moved down again. In this manner, the loop portion 12L1 of FIG. 11 is formed. At this time, according to the present embodiment, no insulating film 13 is interposed between the loop portion 12L1 of the wire 12 and the source electrode pad SE, as described above with reference to FIG. 11. For this reason, a height position to which the wedge tool WT is moved up maybe low. In this manner, a loop length LE1 shown in FIG. 11 can be made short.

Next, in the wire bonding step, by using the wedge tool, the bonding portion 12B2 of the wire 12S1 shown in FIGS. 10 and 11 is bonded to the region SER2 (see FIG. 10) of the bonding surface SEt1 of the source electrode pad SE, the region being exposed from the opening 13H1 (second bonding step). At the second bonding step, the wire 12S1 is thermally compression-bonded to the bonding surface SEt1 as similar to the first bonding step. At this time, ultrasonic waves may be applied.

Next, in the wire bonding step, the wedge tool is moved away from the bonding surface SEt1 shown in FIGS. 10 and 11, and then, is moved toward the wire bonding portion 30W (see FIG. 5) of the lead 30S (see FIG. 5) to form the loop portion 12L2 (see FIG. 11) (second loop formation step). The loop portion 12L2 extends from the semiconductor chip 10 to the leads 30. As a result, after the second loop formation step, the loop portion 12L2 intersects any one of the plurality of sides of the opening 13H1 in a plan view, as shown in FIG. 7. In the example shown in FIG. 7, the loop portion 12L2 of the wire 12S1 intersects the side HS4 (see FIG. 9) of the opening 13H1.

Next, in the wire bonding step, by using the wedge tool, the connecting portion 12B3 (see FIG. 5) of the wire 12S1 (see FIG. 10) is bonded to the upper surface 30t (see FIG. 5) that is the bonding surface of the wire bonding portion 30W (see FIG. 5) of the lead 30S (see FIG. 5) (third bonding step).

Next, in the wire bonding step, the wire 12S1 is cut by using a wire cutter included in the wedge tool (wire cutting step).

By each of the above-described steps, the source electrode pad SE of the semiconductor chip 10 and the lead 30S are electrically connected to each other via the wire 12S shown in FIG. 5.

In the present embodiment, a margin for the positional shift of the bonding position of the wire 12S is small. Therefore, in the wire bonding step, it is preferable to check a degree of the positional shift of the bonding position of the wire 12S after a first wire 12S is bonded, and then, adjust (change if needed) the wire bonding position based on a result of the check. The positional shift is checked at least after the bonding portion 12B1 of the wire 12S1 shown in FIG. 10 is bonded. However, the positional shift may be checked after the wire 12S1 is bonded to the lead 30S shown in FIG. 5. In this manner, position accuracies of second and subsequent wires 12S can be improved. When a plurality of device formation portions LFd are formed in one lead frame LF (see FIG. 17), the positional shift is checked and adjusted in a device formation portion LFd to which the wire bonding step is performed first, among the plurality of device formation portions LFd. In this manner, it is not required to check the positional shift in device formation portions LFd to which the wire bonding step is performed secondly and later.

<Sealing Step>

Figure 18:
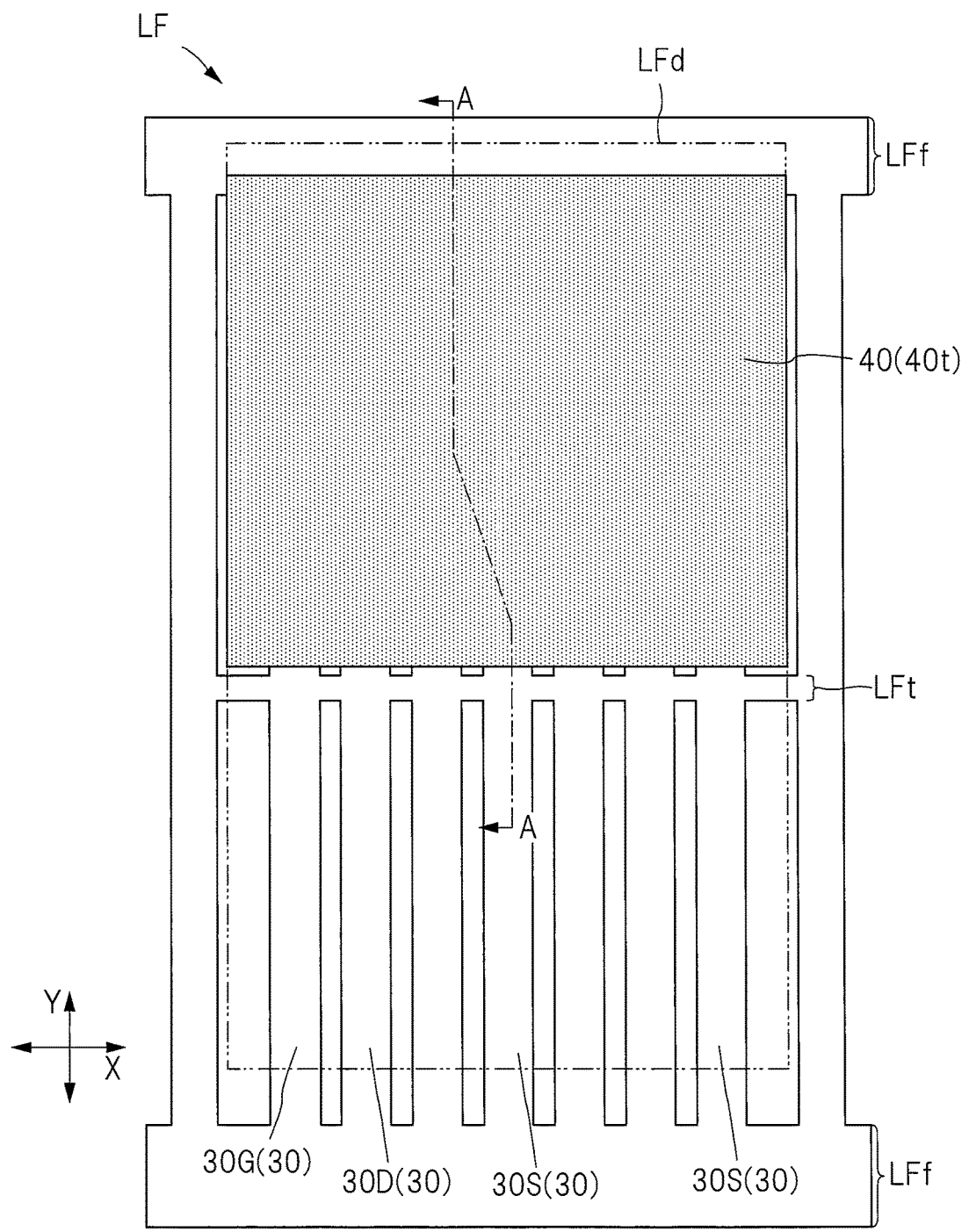
FIG. 18 is an enlarged plan view showing a state in which a sealer that seals the semiconductor chip and the wire is formed at a sealing step shown in FIG. 15.
Figure 19:
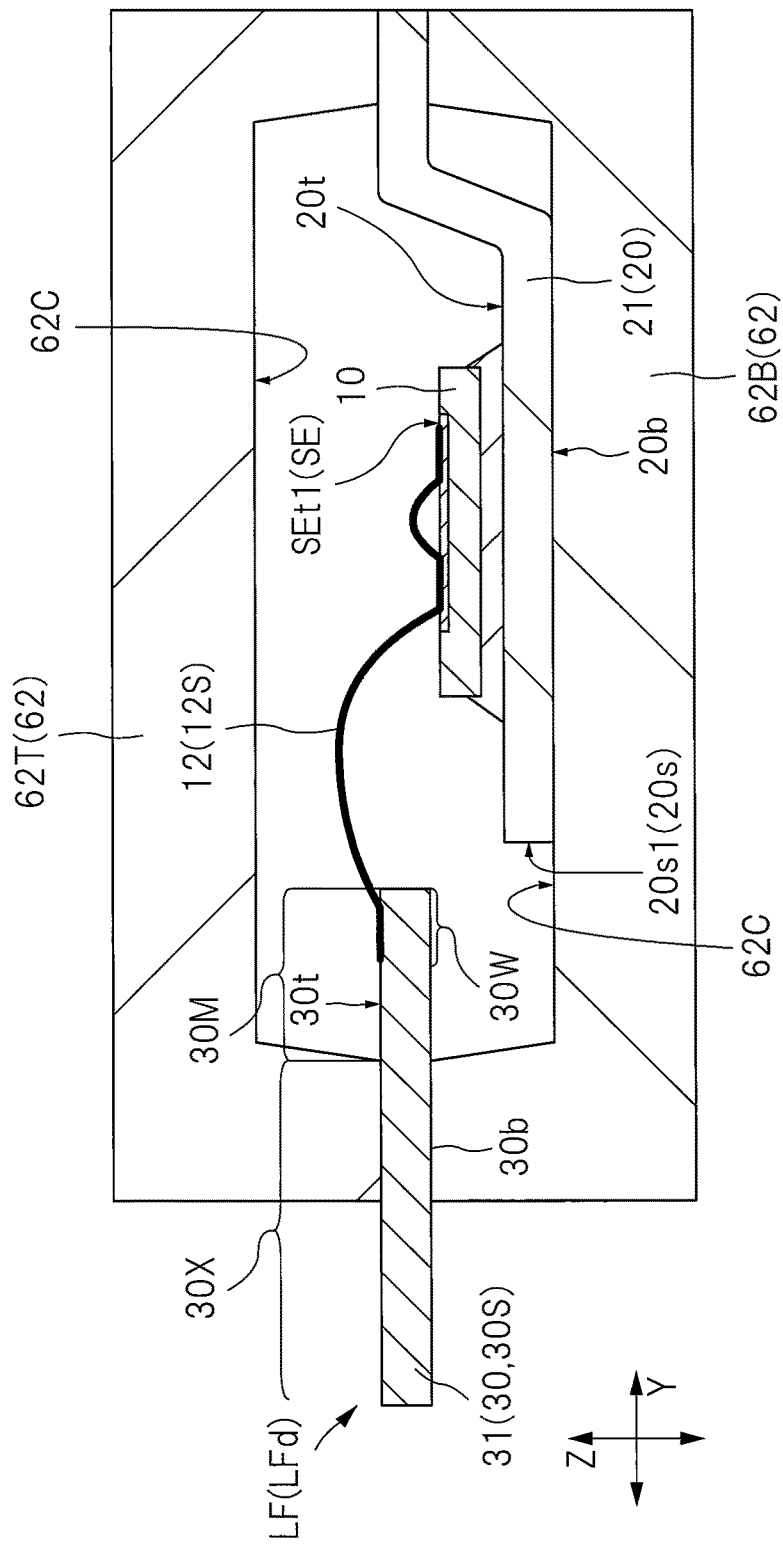
FIG. 19 is an enlarged cross-sectional view showing a state in which the lead frame is placed in a molding die in a cross-sectional surface taken along a line A-A of FIG. 18.
Figure 20:
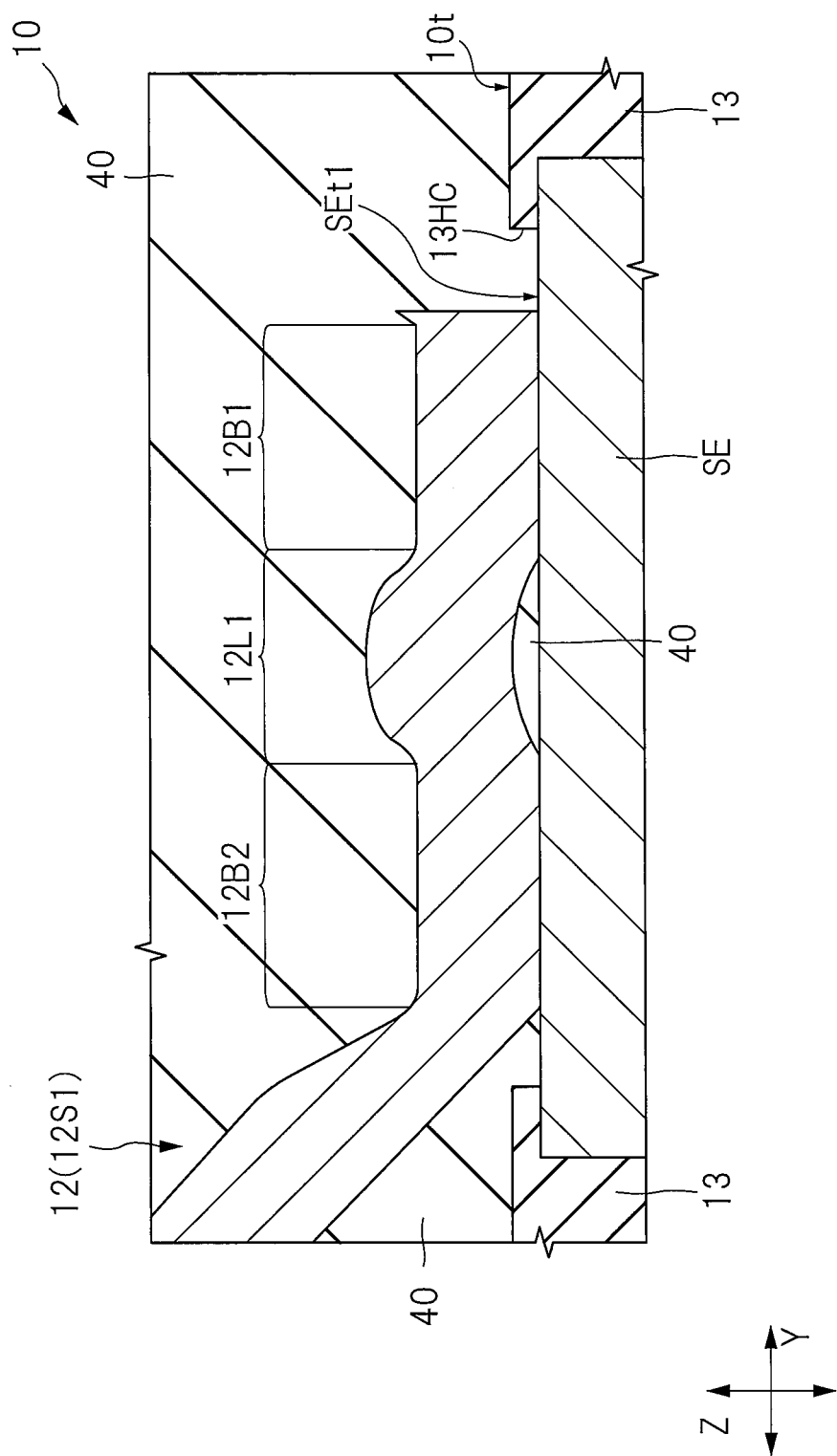
FIG. 20 is an enlarged cross-sectional view showing a periphery of the wire sealed with a resin at the sealing step.

Next, at a sealing step shown in FIG. 15, the semiconductor chip 10, a part of the die pad 20, a part (an inner portion 30M shown in FIG. 19) of each of the plurality of leads 30, and the plurality of wires 12, which are shown in FIG. 5, are sealed with an insulating resin to form the sealer 40 shown in FIG. 18. FIG. 18 is an enlarged plan view showing a state in which the sealer that seals the semiconductor chip and wires 16 is formed at the sealing step shown in FIG. 15. FIG. 19 is an enlarged cross-sectional view showing a state in which the lead frame is placed in a molding die in the cross-sectional surface taken along the line A-A of FIG. 18. FIG. 20 is an enlarged cross-sectional view showing periphery of the wire sealed with the resin at the sealing step.

At the present step, the sealer 40 is formed by, for example, a so-called transfer mold method using a molding die 62 having a top mold (first mold) 62T and a bottom mold (second mold) 62B as shown in FIG. 19.

In the example shown in FIG. 19, the lead frame LF is arranged so that a part of each of the die pad 20 and the plurality of leads 30 in the device formation portion LFd is located inside a cavity 62C formed by the top mold 62T and the bottom mold 62B. The lead frame LF is clamped (sandwiched) by the top mold 62T and the bottom mold 62B. In this state, a raw material of the sealer containing a softened (plasticized) thermosetting resin (insulating resin) is compressively injected into the cavity 62C of the molding die 62, so that the insulating resin is supplied into a space formed by the cavity 62C and the bottom mold 62B, and is molded along the shape of the cavity 62C.

At this time, as shown in FIG. 19, a part of the upper surface 20t of the die pad 20, the part being continuous with the offset part and being located at a relatively high position to be closer to the tip portion, is pressed by the top mold 62T. The lower surface 20b of the die pad 20 is pressed by the bottom mold 62B. In the example shown in FIG. 19, the lower surface 20b of the offset part of the die pad 20 is in close contact with the bottom mold 62B. As a result, as shown in FIG. 18, a part of the lower surface 20b of the die pad 20 is exposed from the sealer 40 after the present step.

As shown in FIG. 20, the sealer 40 is formed at the present step so that the resin making up the sealer 40 is in contact with the bonding surface SEt1. At the present step, the resin infiltrates into a gap between the loop portion 12L1 of the wire 12 and the bonding surface SEt1 or SEt2, so that the sealer 40 is interposed between the loop portion 12L1 of the wire 12 and the bonding surface SEt1 or SEt2.

Incidentally, in a plan view, in a region where the loop portion 12L1 of the wire 12S1 and the bonding surface SEt1 overlap each other, the bonding surface SEt1 is exposed from the insulating film 13 and the wire 12S1 as shown in FIG. 20, and is in close contact with the sealer 40. However, in the region where the loop portion 12L1 of the wire 12S1 and the bonding surface SEt1 overlap each other, the sealer 40 is sandwiched by the bonding surface SEt1 together with the loop portion 12L1 of the wire 12S1. Therefore, in this region, the peeling off between the bonding surface SEt1 and the sealer 40 is difficult to occur. Therefore, in consideration of the peeling off between the bonding surface SEt1 and the sealer 40, it is important to reduce an area of an exposed surface in a region of the bonding surface SEt1, the region not overlapping the wire 12S1, in a plan view as shown in FIG. 10. The exposed surface of the bonding surface SEt1 is preferably particularly small in a region arranged between the adjacent wires 12 as shown in FIG. 7 in the region of the bonding surface SEt1, the region not overlapping the wire 12S1.

As described above, when the contact area between the sealer 40 and the bonding surface SEt1 made of a meal material is large, the peeling off may occur at the bonding interface between the sealer 40 and the bonding surface SEt1 after the present step. Particularly when a separation distance between the adjacent wires 12 is small as shown in FIG. 7, the peeling off tends to occur between the adjacent wires 12. However, as described above, the present embodiment can reduce the area of the part of the bonding interface between the sealer 40 and the bonding surface SEt1, the part where the peeling off tends to occur, and therefore, the peeling off can be suppressed.

After the formation of the sealer 40, the sealer 40 is heated until part of the thermosetting resin contained in the sealer 40 cures (this step causes a so-called temporary curing state). When the lead frame LF can be removed from the molding die 62 by this temporary curing, the lead frame LF is removed from the molding die 62. The lead frame LF is transferred to a heating furnace, and is further subjected to a heat treatment (cure baking). In this manner, the rest of the thermosetting resin cures, so that the sealer 40 of FIG. 18 is obtained.

The sealer 40 is made of the insulating resin as a main component. The functions of the sealer 40 (e.g., resistance to warping distortion) can be improved by, for example, mixing filler particles such as silica (silicon dioxide: $SiO_2$) particles into the thermosetting resin.

<Plating Step>

Next, at a plating step shown in FIG. 15, the lead frame LF shown in FIG. 18 is immersed in a plating solution not shown, so that metal films (metal film 22 and metal film 32 shown in FIG. 6) are formed on respective surfaces of metal portions (outer portions) exposed from the sealer 40.

At the present step, by an electroplating method, the metal films 22 and 32 (FIG. 6) made of, for example, solder are formed on respective surfaces of metal members exposed from the resin. In the electroplating method, the lead frame LF (see FIG. 18) which is a workpiece to be plated is put into a plating bath filled with the plating solution although not shown in the drawings. At this time, the workpiece is connected to a cathode in the plating bath. For example, the frame portion LFf (see FIG. 18) of the lead frame LF is connected electrically to the cathode. Then, by applying, for example, a direct-current voltage to a part between the cathode and an anode which is similarly put into the plating bath, the metal films 22 and 32 are formed on the exposed surfaces of the metal members connected to the frame portion LFf of the lead frame LF. In the present embodiment, the metal films 22 and 32 are formed by a so-called electroplating method.

Although illustration is omitted in FIG. 15, note that chemical polishing may be performed to the surfaces of the die pad 20 and leads 30 of FIG. 18 as a pretreatment at the plating step before the immersion of the lead frame LF into the plating solution. By the pretreatment before the immersion of the lead frame LF into the plating solution, for example, an oxide film, fine burrs, etc., can be removed from the surface of the lead frame LF exposed from the sealer 40 (see FIG. 18).

The metal films 22 and 32 of the present embodiment are made of so-called lead-free solder such as tin (Sn) only, tin-bismuth (Sn—Bi), or tin-copper-silver (Sn—Cu—Ag) that does not substantially contain the lead (Pb) as described above. For this reason, the plating solution used at the present plating step is the electroplating solution containing metal salt such as $Sn^{2-}$ and $Bi^{3+}$. Note that the following explanation will be made about Sn—Bi alloy metal plating as an example of the lead-free solder plating. However, the electroplating solution can be replaced with electroplating solution obtained by replacing bismuth (Bi) with metal such as copper (Cu) and/or silver (Ag), or obtained by adding not only bismuth (Bi) but also copper (Cu) and/or silver (Ag).

In the present embodiment, the plating step is performed while the die pad 20 shown in FIG. 18 (see FIG. 6) is connected electrically to the frame portion LFf via the leads 30. When a voltage is applied to a part between the anode and the cathode while the lead frame LF is immersed in the plating solution, current flows between the anode and the leads 30 and die pad 20 which are connected to the cathode, through the plating solution. At this time, $Sn^{2+}$ and $Bi^{3+}$ in the plating solution deposit on the exposed surfaces of the leads 30 and die pad 20 from the sealer 40 at a predetermined ratio, so that the metal films 22 and 32 shown in FIG. 6 are formed.

<Individualization Step>

Next, at an individualization step shown in FIG. 15, an assembly equivalent to the semiconductor device PKG1 (see FIG. 3) shown in FIG. 3 is separated from the frame portion LFf of the lead frame LF and a tie bar LFt and is individualized as shown in FIG. 18.

At the present step, the frame portion LFf (see FIG. 18) coupled to the plurality of die pads 20 (see FIG. 6) is cut so that the plurality of die pads 20 that are coupled to each other by the flame portion LFf are divided from each other. At the present step, the tie bar LFt (see FIG. 18) is cut, and the boundaries between the plurality of leads 30 and the frame portion LFf are cut, so that the plurality of leads 30 are divided from each other.

As a method of cutting the tie bar LFt, the frame portion LFf, and the leads 30, a machining method (press working) for shearing by pressing a cutting jig to a part to be cut can be used. Since the present step is performed after the plating step, a side surface newly created by the cutting at the present step is exposed from the plating films (the metal films 22 and 33 of FIG. 6).

After the present step, necessary inspections and tests such as an appearance inspection and an electrical test are performed, and a component having passed the tests becomes the semiconductor device PKG1 shown in FIG. 3 as a complete product. The semiconductor device PKG1 is shipped, or is mounted on a mounting substrate not shown.

In the foregoing, the invention made by the present inventors has been concretely described based on the embodiments. However, it is needless to say that the present invention is not limited only to the foregoing embodiments and various modifications described in the above-described embodiments, and can be variously changed within the scope of the present invention. A typical modification example will be described below.

First Modification Example

Figure 21:
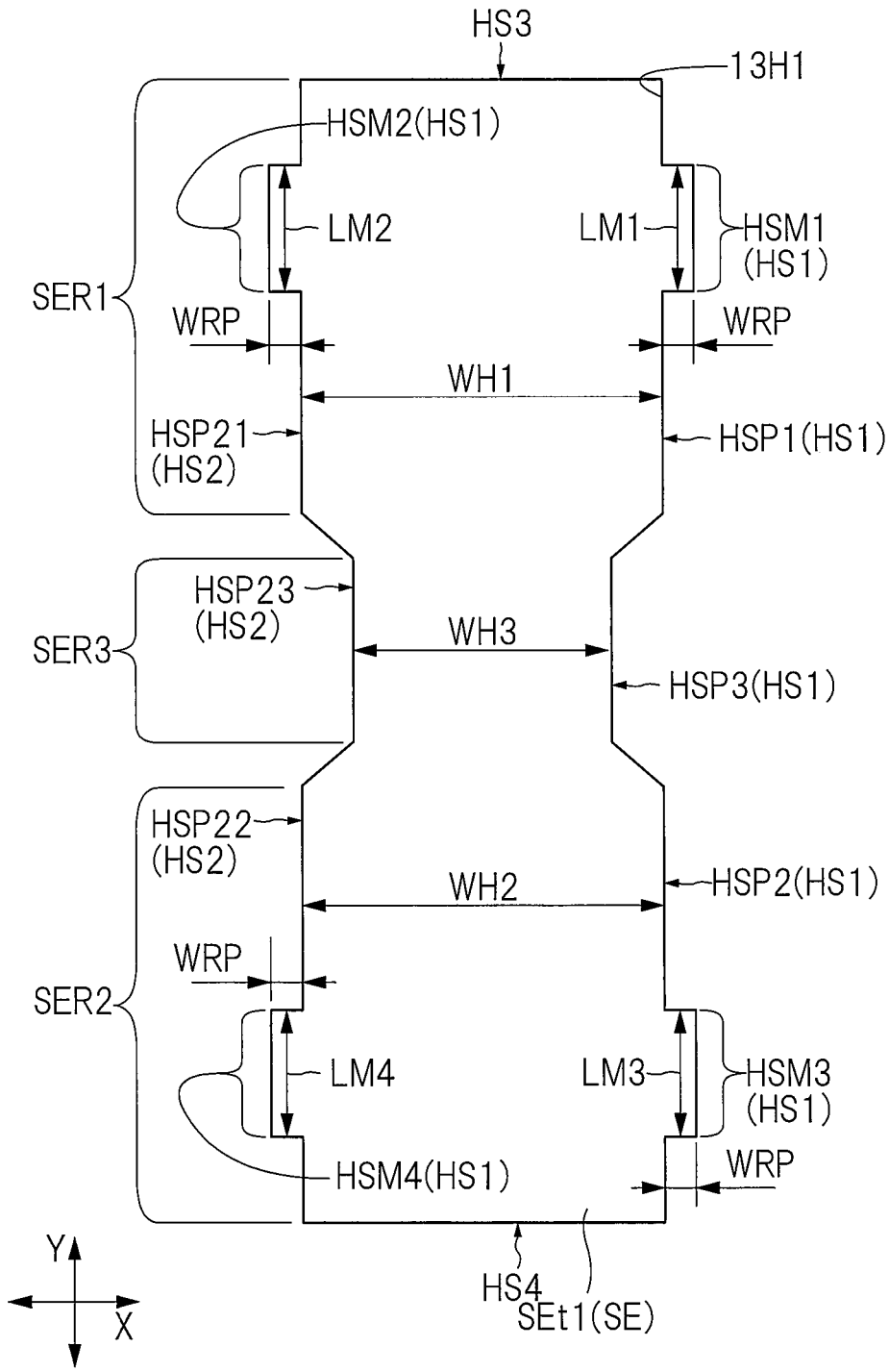
FIG. 21 is an enlarged plan view showing a modification example of FIG. 9.
Figure 22:
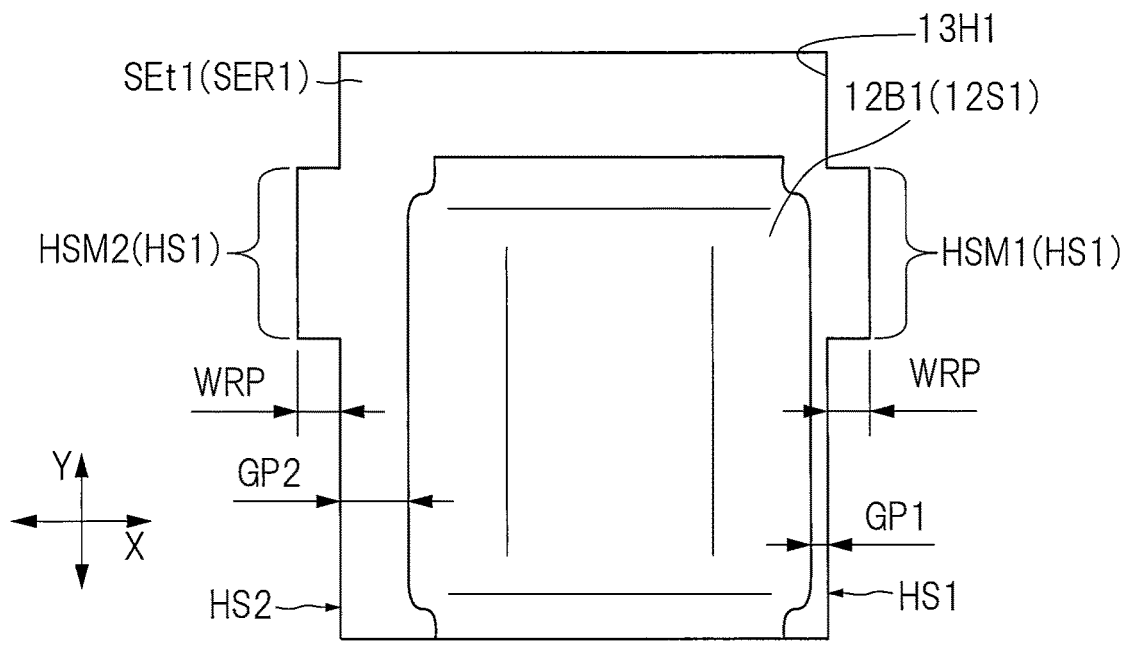
FIG. 22 is an enlarged plan view showing an example of a state in which a wire is bonded to a bonding surface shown in FIG. 21.
Figure 23:
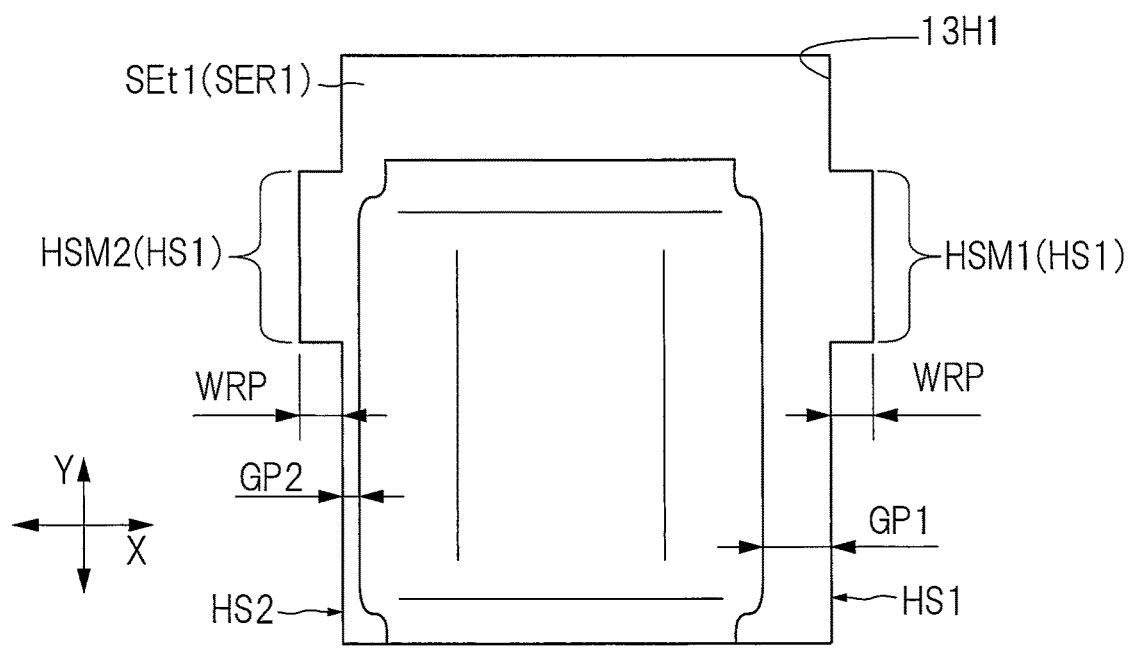
FIG. 23 is an enlarged plan view showing another example of the state in which the wire is bonded to the bonding surface shown in FIG. 21.

As shown in FIGS. 9 and 10, when the exposed area of the bonding surface SEt1 is made small, the margin for the positional shift of the wire bonding position in the wire bonding step is made small. Therefore, in the wire bonding step, it is preferable to check the positional relation between the bonding surface SEt1 and the bonding portion 12B1 or 12B2 of the wire 12S1 visually or by using an image sensor or others, and finely adjust the wire bonding position based on the check result. In the check on the positional relation between the bonding surface SEt1 and the bonding portion 12B1 or 12B2 of the wire 12S1, if the vicinity portion of the bonding portion 12B1 or 12B2 has a mark that achieves the recognition on how much the positional shift is, the fine adjustment can be easily performed. In the present modification example, a structure example in which a part of the bonding surface SEt1 show in FIG. 9 has the mark for the recognition on how much the positional shift is will be described. FIG. 21 is an enlarged plan view showing a modification example of FIG. 9. Each of FIGS. 22 and 23 is an enlarged plan view showing a state example of the wire bonding to the bonding surface shown in FIG. 21.

In a case of the modification example shown in FIG. 21, the region SER1 of the bonding surface SEt1 has a protruding portion HSM1 that protrudes from the side HS1 of the opening 13H1 in the X direction and a protruding portion HSM2 that protrudes from the side HS2 of the opening 13H1 in the X direction. The region SER2 of the bonding surface SEt1 has a protruding portion HSM3 that protrudes from the side HS1 of the opening 13H1 in the X direction and a protruding portion HSM4 that protrudes from the side HS2 of the opening 13H1 in the X direction.

Each of the protruding portions HSM1, HSM2, HSM3 and HSM4 protrudes from an in-plane portion of the bonding surface SEt1 toward the insulating film 13 (see FIG. 7). And, in the wire bonding step, each of the protruding portions HSM1, HSM2, HSM3 and HSM4 is the mark for the reference in the check on how much the positional shift of the bonding position of the wire 12S1 is. Specifically, in the wire bonding step, the positional shift amount of the bonding portion 12B1 or 12B2 of the wire 12S1 shown in FIG. 10 is checked with reference to an X-direction length (width) WRP of the protruding portion HSM1, HSM2, HSM3 or HSM4. Values of the X-direction lengths (widths) WRP of the protruding portion HSM1, HSM2, HSM3 and HSM4 shown in FIG. 21 are equal to one another, each of which is, for example, 50 µm. This value as 50 µm is an upper limit value of the allowable positional shift amount in the wire bonding step.

In a plan view, each of a Y-direction length LM1 of the protruding portion HSM1 and a Y-direction length LM2 of the protruding portion HSM2 is shorter than a Y-direction length of the region SER1. In other words, the protruding portion HSM1 is formed in a part of the side HS1 of the region SER1. The protruding portion HSM2 is formed in a part of the side HS2 of the region SER1. Each of a Y-direction length LM3 of the protruding portion HSM3 and a Y-direction length LM4 of the protruding portion HSM4 is shorter than a Y-direction length of the region SER2. Since the protruding portion HSM1 is formed in a part of the region SER1, a separation distance GP1 between the side HS1 and the bonding portion 12B1 can be compared with the X-direction length WRP of the protruding portion HSM1 as shown in FIGS. 22 and 23. The same goes for the protruding portions HSM2, HSM3 and HSM4.

When the mark serving as a guide for the positional shift amount is formed in the region SER1 of the bonding surface SEt1 as described in the present modification example, if the position of the bonding portion 12B1 shifts from a predetermined position of the region SER1 of the bonding surface SEt1 as shown in FIGS. 22 and 23, the shift amount can be easily checked. For example, when the bonding portion 12B1 is closer to the side HS1 of the opening 13H1 as shown in FIG. 22, it can be easily checked how much the shift amount from the allowable value is, by the comparison of the separation distance GP1 between the side HS1 and the bonding portion 12B1 with the X-direction length WRP of the protruding portion HSM1.

When the bonding portion 12B1 is closer to the side HS2 of the opening 13H1 as shown in FIG. 23, it can be easily checked how much the shift amount from the allowable value is, by the comparison of the separation distance GP2 between the side HS2 and the bonding portion 12B1 with the X-direction length WRP of the protruding portion HSM2. As shown in FIG. 21, when the protruding portions HSM1 and HSM2 are formed on both of the sides HS1 and HS2, the shift amount can be recognized at a high accuracy.

However, as shown in FIG. 23, also when the bonding portion 12B1 is closer to the side HS2 of the opening 13H1, the separation distance GP1 between the side HS1 and the bonding portion 12B1 may be compared with the X-direction length WRP of the protruding portion HSM1. Also in this case, it can be recognized how much the positional shift of the bonding portion 12B1 is.

In the example shown in FIG. 21, the protruding portions HSM3 and HSM4 are formed in the region SER2 of the bonding surface SEt1. As shown in FIG. 10, each of the bonding portion 12B1, the loop portion 12L1 and the bonding portion 12B2 of the wire 12S1 is linearly arranged in the Y direction. Therefore, as long as at least any one of the protruding portions HSM1, HSM2, HSM3 and HSM4 shown in FIG. 21 is formed, the shift amount can be recognized. However, as shown in FIG. 21, when the protruding portion is formed in each of the regions SER1 and SER2, even if an angle of the extension direction of the wire 12S1 shown in FIG. 10 is tilted from the Y direction, it is easily recognized how much the tilt angle is.

Each length WRP of the protruding portions HSM1, HSM2, HSM3 and HSM4 shown in FIG. 21 is changeable in accordance with a setting value in the allowable range in the wire bonding step. However, when this value is extremely large, the protruding portion HSM1, HSM2, HSM3 or HSM4 becomes a start point of the above-described peeling off in some cases. Therefore, the length WRP is preferably enough small not to cause the peeling off. In the example shown in FIG. 21, the length WRP is 50 μm, and is shorter than each of the lengths LM1, LM2, LM3 and LM4. Each of the lengths LM1, LM2, LM3 and LM4 is, for example, about 200 μm. The length WRP is preferably smaller than the separation distance GP1 or GP2 shown in FIGS. 22 and 23, whichever is larger. For example, in the example shown in FIGS. 22 and 23, a total value of the separation distances GP1 and GP2 is 100 μm. Therefore, if the length WRP is 50 μm, the above-described conditions are satisfied except for a case of the separation distance GP1 of 50 μm.

Figure 24:
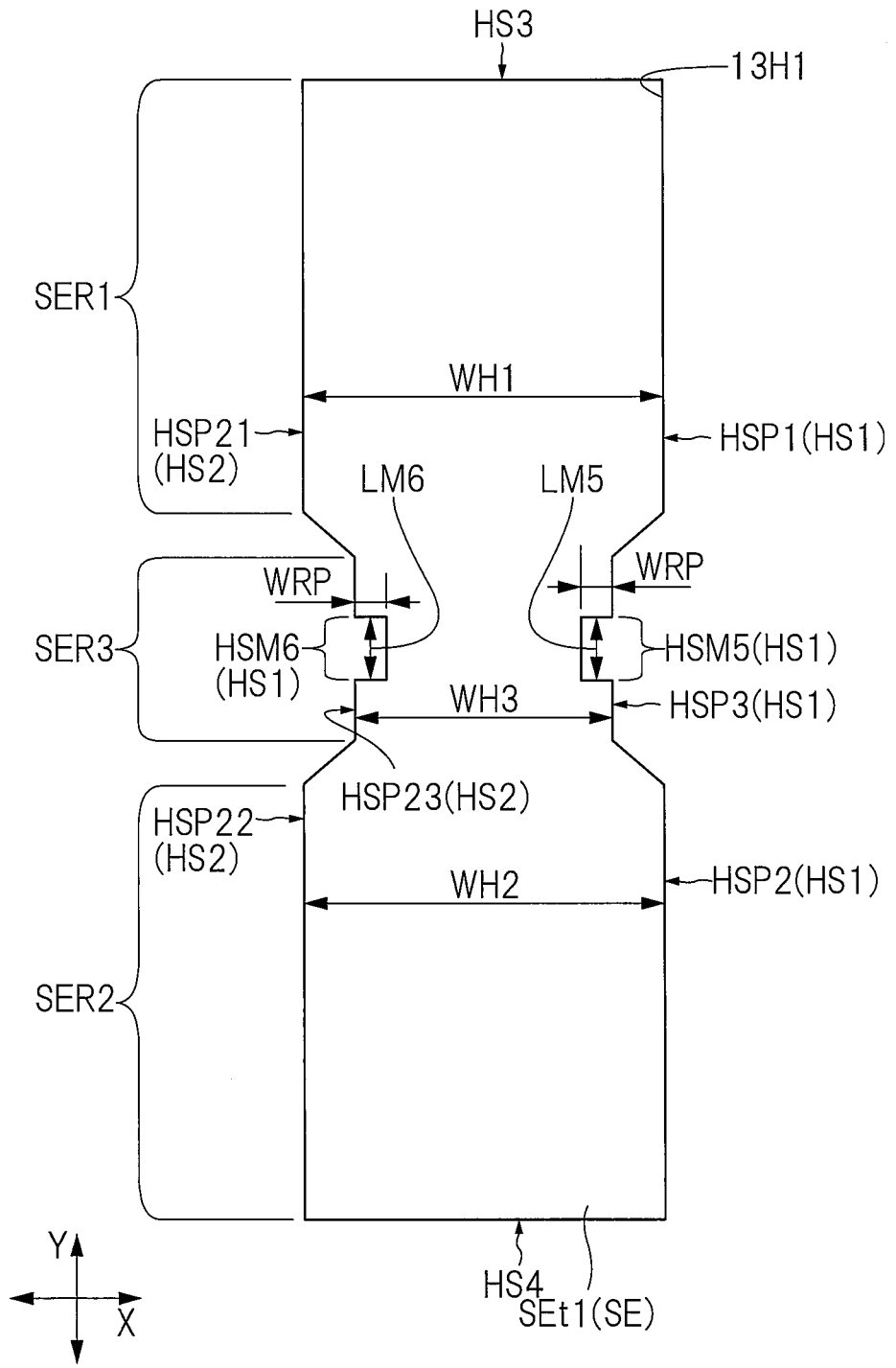
FIG. 24 is an enlarged plan view showing a modification example of FIG. 21.
Figure 25:
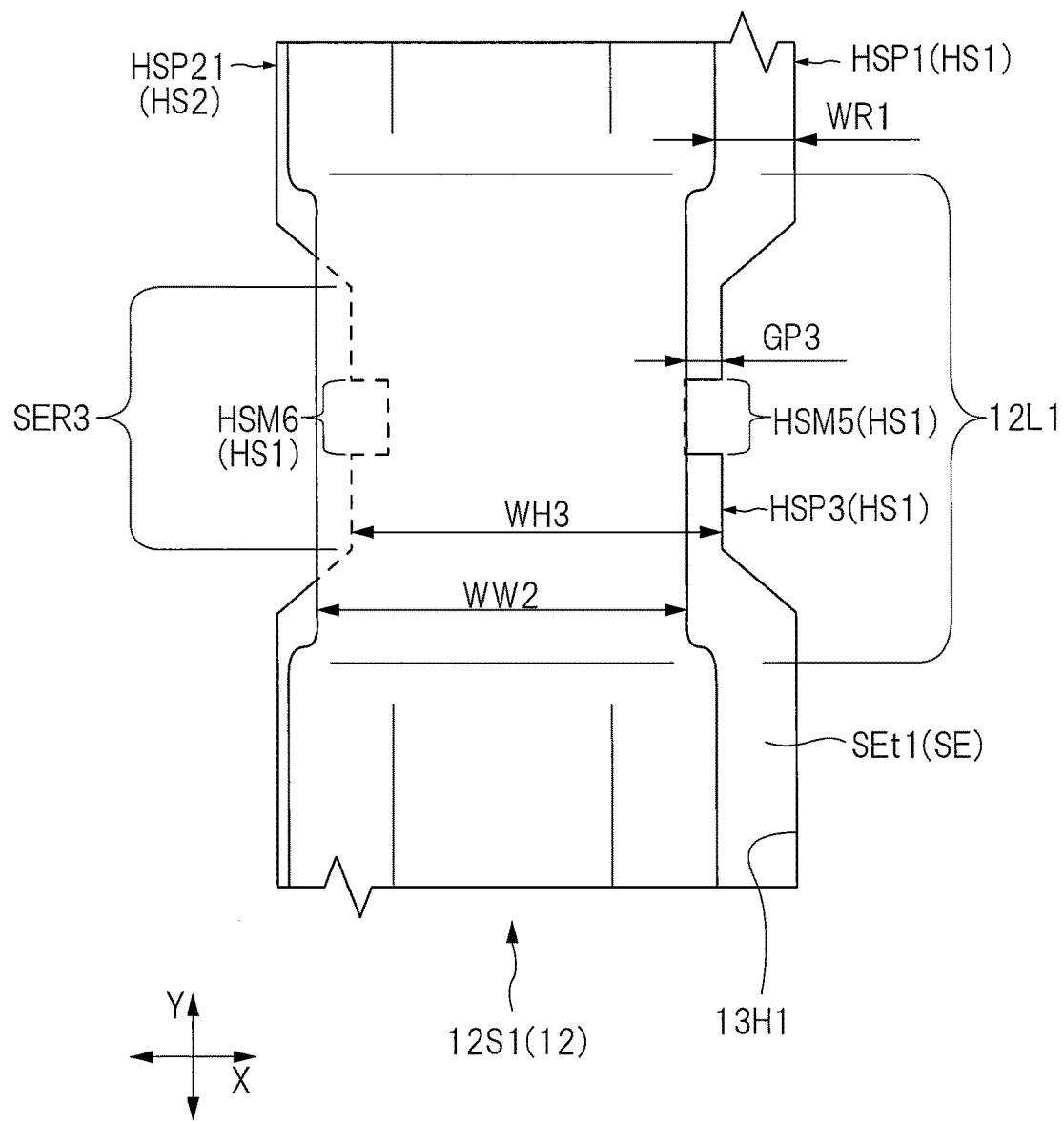
FIG. 25 is an enlarged plan view showing an example of a state in which a wire is bonded to a bonding surface shown in FIG. 24.

In FIGS. 21 to 23, the example of the arrangement of the mark for recognizing the positional shift amount in the vicinity of the bonding portion 12B1 of the wire 12S1 (see FIG. 22) has been described. However, the mark may be formed in the region SER3 shown in FIG. 9. FIG. 24 is an enlarged plan view showing a modification example of FIG. 21. FIG. 25 is an enlarged plan view showing a state example of wire bonding to a bonding surface shown in FIG. 24.

In the modification example shown in FIG. 24, the region SER3 of the bonding surface SEt1 has a hollow portion HSM5 that is hollowed from the side HS1 of the opening 13H1 toward the region SER3 in the X direction and a hollow portion HSM6 that is hollowed from the side HS2 of the opening 13H1 toward the region SER3 in the X direction.

Each of the hollow portions HSM5 and HSM6 hollows so as to intrude into the region SER3 of the bonding surface SEt1. Each of the hollow portions HSM5 and HSM6 is the mark for the reference in the check on how much the positional shift of the bonding position of the wire 12S1 is, in the wire bonding step. Specifically, in the wire bonding step, the positional shift amount is checked by the check on the positional relation between the X-direction length (width) WRP of each of the hollow portions HSM5 and HSM6 and the loop portion 12L1 of the wire 12S1 shown in FIG. 10. The X-direction lengths (widths) WRP of the hollow portions HSM5 and HSM6 shown in FIG. 21 are the same as each other, each of which is, for example, 50 μm. This value as 50 μm is an upper limit value of the allowable positional shift amount in the wire bonding step as described above.

In a plan view, each of a Y-direction length LM5 of the hollow portion HSM5 and a Y-direction length LM6 of the hollow portion HSM6 is shorter than the X-direction length of the region SER3. In other words, the hollow portion HSM5 is formed in a part of the side HS1 of the region SER3. The hollow portion HSM6 is formed in a part of the side HS2 of the region SER3. Since the hollow portion HSM5 is formed in a part of the region SER3, an X-direction length GP3 of a part of the hollow portion HSM5 in a plan view as shown in FIG. 25, the part being exposed from the loop portion 12L1, can be easily recognized.

When the mark serving as the guide for the positional shift amount is formed in the region SER3 of the bonding surface SEt1 as described in the present modification example, if the position of the loop portion 12L1 shifts from a predetermined position of the region SER3 of the bonding surface SEt1 as shown in FIG. 25, the shift amount can be easily checked. As described above, each of the bonding portion 12B1, the loop portion 12L1 and the bonding portion 12B2 of the wire 12S1 shown in FIG. 10 is linearly arranged in the Y direction. Therefore, if the shift amount in the loop portion 12L1 can be recognized, the shift amount in each of the bonding portions 12B1 and 12B2 can be estimated.

In the example shown in FIG. 21, an opening area of the opening 13H1 is larger than that in a case without the protruding portions HSM1, HSM2, HSM3 and HSM4. Therefore, for example, when the separation distance between the openings 13H1 and 13H2 that are adjacent to each other is small as shown in FIG. 7, it is required to consider the layout so that the protruding portions HSM1, HSM2, HSM3 and HSM4 formed in the openings 13H1 and 13H2 do not communicate with one another.

On the other hand, in the example shown in FIG. 24, an opening area of the opening 13H1 is smaller than that in a case without the hollow portions HSM5 and HSM6. Therefore, even if the separation distance between the openings 13H1 and 13H2 that are adjacent to each other is small as shown in FIG. 7, a degree of freedom of the layout is high.

When the position of the wire 12S1 is closer to the side HS2 of the opening 13H1 as shown in FIG. 25, note that the hollow portion HSM6 formed in the side HS2 cannot be visually recognized. On the other hand, when the position of the wire 12S1 is closer to the side HS1 of the opening 13H1, the hollow portion HSM5 formed in the side HS1 cannot be visually recognized. Therefore, for recognizing the shift amount regardless of when the position of the wire 12S1 is closer to either the side HS1 or HS2, the hollow portion is preferably formed in both of the sides HS1 and HS2 as shown in FIG. 24.

In the example shown in FIG. 24, the protruding portions HSM1, HSM2, HSM3 and HSM4 that have been described with reference to FIG. 21 are not formed. However, as a modification example, one or more of the protruding portions HSM1, HSM2, HSM3 and HSM4 shown in FIG. 21 may be formed in addition to the hollow portions HSM5 and HSM6 shown in FIG. 25.

Second Modification Example

Figure 26:
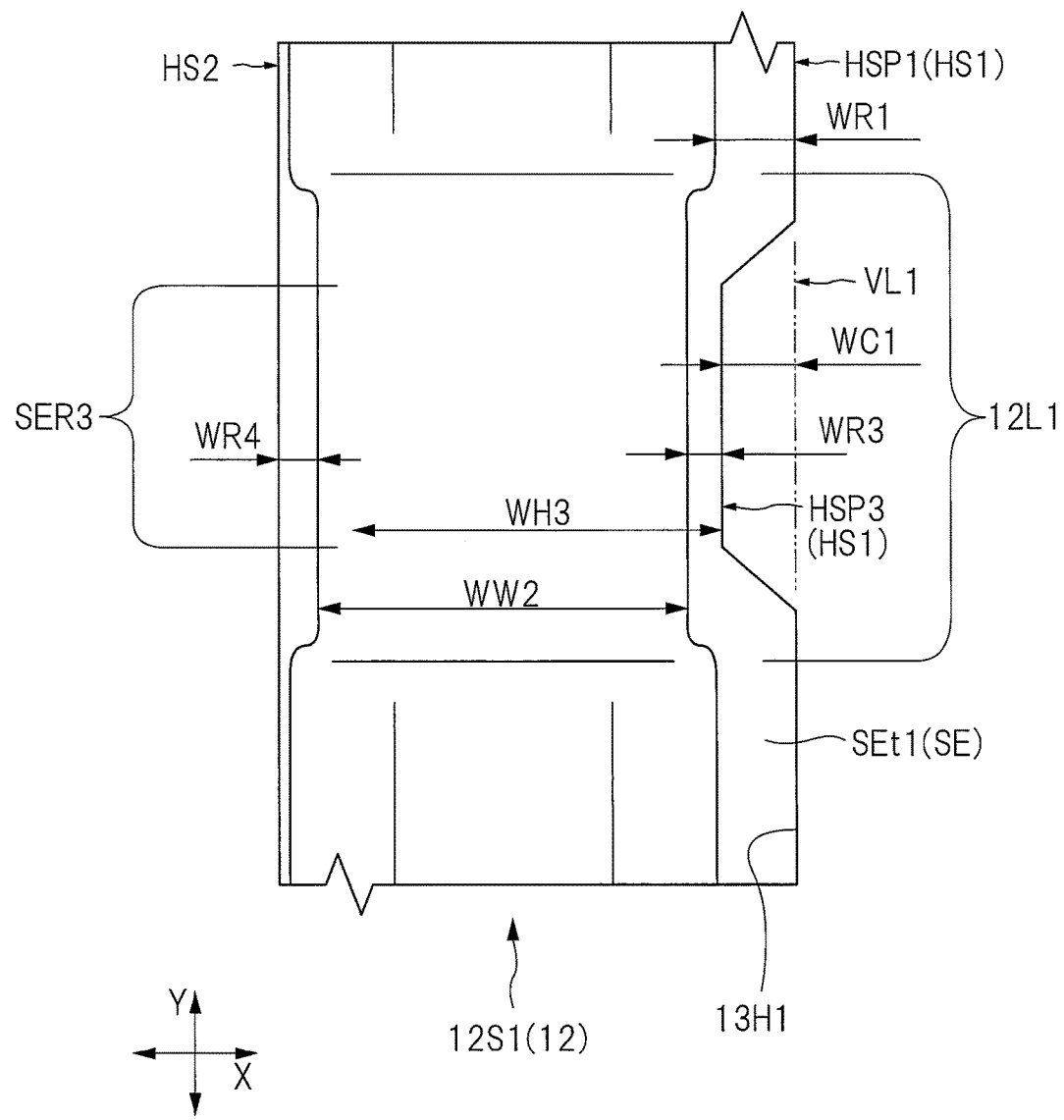
FIG. 26 is an enlarged plan view showing a modification example of FIG. 13.

The embodiment has exemplified and described, for example, the aspect as shown in FIG. 9 in which the narrow portion is formed in both of the sides HS1 and HS2 of the opening 13H1. However, as a modification example, the narrow portion may be formed in either the side HS1 or HS2 as shown in FIG. 26. FIG. 26 is an enlarged plan view showing a modification example of FIG. 13.

The bonding surface SEt1 shown in FIG. 26 is different from the bonding surface SEt1 shown in FIG. 13 in that the bonding surface SEt1 shown in FIG. 26 does not have the portion HSP23 shown in FIG. 13 that is closer to the side HS2 of the opening 13H1 so that the side HS2 linearly extends.

Even in the case of the modification example shown in FIG. 26, when the bonding position of the wire 12S1 is closer to the side HS2, the width WR4 between the side HS2 and the loop portion 12L1 of the wire 12S1 becomes smaller than 100 μm. On the other hand, when the bonding position of the wire 12S1 is closer to the side HS1 although not shown in the drawing, the width WR4 becomes 150 μm in some cases.

However, while the plurality of wires 12S are arranged so as to be adjacent to one another as shown in FIG. 5, the wire 12S1 is arranged at an end of the arrangement as shown in FIG. 7. The wire 12S is not arranged so as to be closer to the side HS2 of the opening 13H1. Therefore, when the example shown in FIG. 26 is compared with the study example shown in FIG. 12 in a case of the width WR3 of 150 μm, the peeling off is difficult to occur in the case of the width WR3 of 150 μm.

When the bonding surfaces (openings) are arranged so as to be adjacent to one another as described above, the narrow portion is provided in either the side HS1 or HS2 on the bonding surface arranged at the end of the arrangement in some cases.

Third Modification Example

The embodiment has described, for example, the aspect as shown in FIG. 8 in which the plurality of portions of one source electrode pad SE are exposed from the plurality of openings 13H1 formed in the insulating film 13. However, the bonding surface SEt1 shown in FIG. 8 may be a part of the first source electrode pad (electrode, source electrode) SE1 covered with the insulating film 13, and the bonding surface SEt2 shown in FIG. 8 may be a part of the second source electrode pad (electrode, source electrode) SE2 covered with the insulating film 13.

Fourth Modification Example

The embodiment has described, for example, the case as shown in FIG. 7 in which each shape of the bonding surface SEt1 and the bonding surface SEt2 is rectangular. However, each shape of the bonding surface SEt1 and the bonding surface SEt2 is not limited to the rectangular shape, and has various modification examples such as a polygon and a circle (including an ellipse).

Fifth Modification Example

As another modification example of FIG. 7, the wire 12S1 may be bonded to one bonding surface SEt1 at three or more parts although illustration is omitted. In this case, the area of the bonding between the wire 12S1 and the bonding surface SEt1 increases, and therefore, the impedance of the conductive path passing through the wire 12S1 can be reduced. This can be also said to the wire 12S2.

However, in a case of the large number of the bonding parts between the wire 12S1 and the bonding surface SEt1, the Y-direction length of the bonding surface SEt1 (for example, the lengths of the sides HS1 and HS2 in the example shown in FIG. 7) is large. In this case, a stress caused by a difference in linear expansion coefficient between the sealer 40 (see FIG. 20) and the source electrode pad SE is particularly large on both ends of the bonding surface SEt1 in the Y direction (large in the vicinity of the sides HS3 and HS4 in FIG. 7). Therefore, from the viewpoint of reducing the Y-direction length of the source electrode pad SE, an aspect in which the wire 12S1 is bonded to one bonding surface SEt1 at two parts as shown in FIG. 7 is particularly preferable.

Sixth Modification Example

In the above-described embodiment, a MOSFET is exemplified as an example of a power transistor included in a power semiconductor device. However, various modification examples are applicable. For example, an IGBT may be provided instead of the MOSFET. This case can be applied by interpreting the drain of the MOSFET in the embodiment described above as the collector of the IGBT and interpreting the source of the MOSFET as the emitter of the IGBT. When the IGBT is used, a diode (free wheeling diode (FWD)) chip that controls a flow direction of a load current is mounted separately from an IGBT chip in many cases. Thus, on the die pad 20 shown in FIG. 5, the IGBT chip and the FWD chip are mounted.

In the above-described embodiment, the power semiconductor device has been exemplified and described as an example of a semiconductor device to which severe conditions in environment temperature and temperature cycle load resistance tend to be required. However, even in a case of a semiconductor device (such as a control-system semiconductor device and a communication-system semiconductor device) other than the power semiconductor device, if a specification of the demands in the environment temperature and the temperature cycle load resistance is high, performances concerning the environment temperature and the temperature cycle load resistance can be improved by applying the techniques described in the above-described embodiment and modification examples. In the semiconductor device other than the power semiconductor device, a gold (Au) wire is used as the wire, and the ball bonding method is used as the wire bonding method in many cases.

Seventh Modification Example

The above embodiments have described the aspect in which, for example, the X direction which is the direction of arrangement of the bonding surfaces SEt1 and SEt2 and the Y direction which is the direction of extension of the bonding surfaces SEt1 and SEt2 extend along the respective outer peripheral sides of the front surface 10t of the semiconductor chip 10 as seen in the semiconductor chip 10 of FIG. 7. However, the configurations described above are also applicable to a case in which the X and Y directions intersect the respective outer peripheral sides of the front surface 10t of the semiconductor chip 10 at an angle other than a right angle.

Eighth Modification Example

The various modification examples have been explained as described above. However, for example, the modification examples described above can be combined with one another and applied. And, parts of the modification examples may be extracted and combined with one another.

What is claimed is:

1. A semiconductor device comprising:
a semiconductor chip having an electrode pad including a first bonding surface and having an insulating film including a first opening that exposes the first bonding surface of the electrode pad;
a first wire bonded to the first bonding surface of the electrode pad; and
a sealer sealing the semiconductor chip and the first wire so that the sealer is in contact with the first bonding surface of the electrode pad,
wherein the first bonding surface is made of metal,
the sealer is made of an insulating material,
the first bonding surface includes, in a plan view,
a first region;
a second region; and
a third region between the first region and the second region,
the first wire includes:
a first bonding portion bonded to the first region of the first bonding surface;
a second bonding portion bonded to the second region of the first bonding surface; and
a first middle portion located between the first bonding portion and the second bonding portion,
in a plan view, the first middle portion extends in a first direction, and the first middle portion and the third region are separated from each other, and,
in a plan view, each of a width of the first region in a second direction orthogonal to the first direction and a width of the second region in the second direction is larger than a width of the third region in the second direction.

2. The semiconductor device according to claim 1,
wherein the first opening includes:
a first side formed on one end of the first opening in the second direction and extending in the first direction; and
a second side formed on an end opposite to the first side and extending in the first direction,
the first side bends at each of a part between the first region and the third region and a part between the second region and the third region, and
the second side bends at each of apart between the first region and the third region and a part between the second region and the third region.

3. The semiconductor device according to claim 1,
wherein, in a plan view, a width of the third region in the second direction is equal to or smaller than a width of the first middle portion of the first wire in the second direction.

4. The semiconductor device according to claim 1,
wherein, in the second direction, a second wire is arranged adjacent to the first wire, and
a separation distance between the first wire and the second wire in the second direction is smaller than a wire diameter of the first wire.

5. The semiconductor device according to claim 1,
wherein the first opening includes, in a plan view,
a first side extending in the first direction; and
a second side opposite to the first side,
the first side includes, in a plan view,
a first portion extending along the first region;
a second portion extending along the second region; and
a third portion located between the first portion and the second portion and extending along the third region, and
a width between an extension line of the first portion of the first side and the third portion is larger than a width between the third portion of the first side and the first middle portion of the first wire.

6. The semiconductor device according to claim 1,
wherein the first opening includes, in a plan view,
a first side extending in the first direction; and
a second side opposite to the first side,
the first side includes, in a plan view,
a first portion extending along the first region;
a second portion extending along the second region; and
a third portion located between the first portion and the second portion and extending along the third region,
the second side includes, in a plan view,
a fourth portion extending along the first region;
a fifth portion extending along the second region; and
a sixth portion located between the fourth portion and the fifth portion and extending along the third region,
the third portion of the first side is located between an extension line of the first portion and the second side, and
the sixth portion of the second side is located between an extension line of the fourth portion and the first side.

7. The semiconductor device according to claim 1,
wherein the first region of the first bonding surface has a first protruding portion protruding in the second direction, and,
in a plan view, a length of the first protruding portion in the first direction is shorter than a length of the first region in the first direction.

8. The semiconductor device according to claim 7,
wherein, in a plan view, a length of the first protruding portion in the second direction is shorter than a length of the first protruding portion in the first direction.

9. The semiconductor device according to claim 1,
wherein the first opening includes, in a plan view,
a first side extending in the first direction; and a second side opposite to the first side, the first region of the first bonding surface includes:
  a first protruding portion protruding in the second direction from the first side of the first opening; and
  a second protruding portion protruding in the second direction from the second side of the first opening, and
in a plan view, each of a length of the first protruding portion in the first direction and a length of the second protruding portion in the first direction is shorter than a length of the first region in the first direction.

10. The semiconductor device according to claim 9,
wherein the second region of the first bonding surface includes, in a plan view,
  a third protruding portion protruding in the second direction from the first side of the first opening; and
  a fourth protruding portion protruding in the second direction from the second side of the first opening, and
in a plan view, each of a length of the third protruding portion in the first direction and a length of the fourth protruding portion in the first direction is shorter than a length of the second region in the first direction.

11. The semiconductor device according to claim 1,
wherein the third region of the first bonding surface has a first hollow portion hollowing in the second direction toward the third region, and,
in a plan view, a length of the first hollow portion in the first direction is shorter than a length of the third region in the first direction.

12. The semiconductor device according to claim 1,
wherein the first opening includes, in a plan view,
  a first side extending in the first direction; and
  a second side opposite to the first side,
the third region of the first bonding surface includes:
  a first hollow portion hollowing in the second direction from the first side of the first opening toward the second side; and
  a second hollow portion hollowing in the second direction from the second side of the first opening toward the second side, and
in a plan view, each of a length of the first hollow portion in the first direction and a length of the second hollow portion in the first direction is shorter than a length of the third region in the first direction.

13. The semiconductor device according to claim 1,
wherein the third region has a mark formed by intrusion of a test terminal.

14. A semiconductor device comprising:
a semiconductor chip having an electrode pad including a first bonding surface and having an insulating film including a first opening exposing the first bonding surface of the electrode pad;
a first wire bonded to the first bonding surface of the electrode pad; and
a sealer sealing the semiconductor chip and the first wire so that the sealer is in contact with the first bonding surface of the electrode pad,
wherein the first bonding surface is made of metal,
the sealer is made of an insulating material,
the first wire includes:
  a first bonding portion bonded to the first bonding surface;
  a second bonding portion bonded to the first bonding surface; and
  a first middle portion located between the first bonding portion and the second bonding portion,
in a plan view, the first middle portion extends in a first direction, and the first middle portion and the first bonding surface are separated from each other,
the first opening includes, in a plan view,
  a first side extending in the first direction;
  a second side opposite to the first side;
  a third side extending in a second direction orthogonal to the first direction; and
  a fourth side opposite to the third side,
the first side includes, in a plan view,
  a first portion extending in the first direction;
  a second portion extending in the first direction; and
  a third portion located between the first portion and the second portion and extending in the first direction, and,
in the second direction in a plan view, the first bonding portion is located between the first portion of the first side and the second side,
in the second direction in a plan view, the second bonding portion is located between the second portion of the first side and the second side,
in the second direction in a plan view, the first middle portion is located between the third portion of the first side and the second side, and,
in a plan view, each of a length in the second direction from the first portion of the first side to the second side and a length in the second direction from the second portion of the first side to the second side is larger than a length in the second direction from the third portion to the second side.

15. The semiconductor device according to claim 14,
wherein the second side includes, in a plan view,
  a fourth portion extending in the first direction;
  a fifth portion extending in the first direction; and
  a sixth portion located between the first portion and the second portion and extending in the first direction,
the third portion of the first side is located between an extension line of the first portion and the second side, and
the sixth portion of the second side is located between an extension line of the fourth portion and the first side.

16. The semiconductor device according to claim 14,
wherein a region of the first bonding surface, the region overlapping the first middle portion of the first wire, has a mark formed by intrusion of a test terminal.

* * * * *